United States Patent
Lee et al.

(10) Patent No.: US 11,211,425 B2
(45) Date of Patent: Dec. 28, 2021

(54) MAGNETIC MEMORY DEVICES

(71) Applicant: Samsung Electronics Co., Ltd., Suwon-si (KR)

(72) Inventors: Kilho Lee, Busan (KR); Gwanhyeob Koh, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/895,602

(22) Filed: Jun. 8, 2020

(65) Prior Publication Data

US 2021/0082998 A1 Mar. 18, 2021

(30) Foreign Application Priority Data

Sep. 16, 2019 (KR) .................. 10-2019-0113440

(51) Int. Cl.
| | |
|---|---|
| *H01L 27/22* | (2006.01) |
| *H01L 23/522* | (2006.01) |
| *H01L 43/10* | (2006.01) |
| *H01L 43/02* | (2006.01) |

(52) U.S. Cl.
CPC ........ *H01L 27/222* (2013.01); *H01L 23/5226* (2013.01); *H01L 43/02* (2013.01); *H01L 43/10* (2013.01)

(58) Field of Classification Search
CPC ... H01L 27/222; H01L 23/5226; H01L 43/02; H01L 43/10
See application file for complete search history.

(56) References Cited

U.S. PATENT DOCUMENTS

| | | |
|---|---|---|
| 8,896,041 B2 | 11/2014 | De Brosse et al. |
| 9,105,830 B2 | 8/2015 | Khvalkovskiy et al. |
| 9,508,923 B2 | 11/2016 | Suzuki |
| 9,608,039 B1 | 3/2017 | Apalkov et al. |
| 10,020,039 B2 | 7/2018 | Fukami et al. |
| 2017/0092852 A1* | 3/2017 | Son ................. H01L 43/02 |
| 2018/0159023 A1* | 6/2018 | Suh .................. H01L 43/08 |
| 2019/0006416 A1 | 1/2019 | Lee et al. |
| 2019/0148629 A1 | 5/2019 | Sasaki et al. |
| 2019/0189516 A1 | 6/2019 | Sasaki et al. |

* cited by examiner

*Primary Examiner* — Marc Anthony Armand
(74) *Attorney, Agent, or Firm* — Myers Bigel, P.A.

(57) ABSTRACT

A magnetic memory device includes a magnetic tunnel junction pattern on a substrate, a first conductive pattern between the substrate and the magnetic tunnel junction pattern, lower contact plugs between the first conductive pattern and the substrate and disposed at respective sides of the magnetic tunnel junction pattern, and second conductive patterns on the lower contact plugs, respectively. The second conductive patterns connect the lower contact plugs to the first conductive pattern. The second conductive patterns include a ferromagnetic material.

20 Claims, 28 Drawing Sheets

FIG. 1
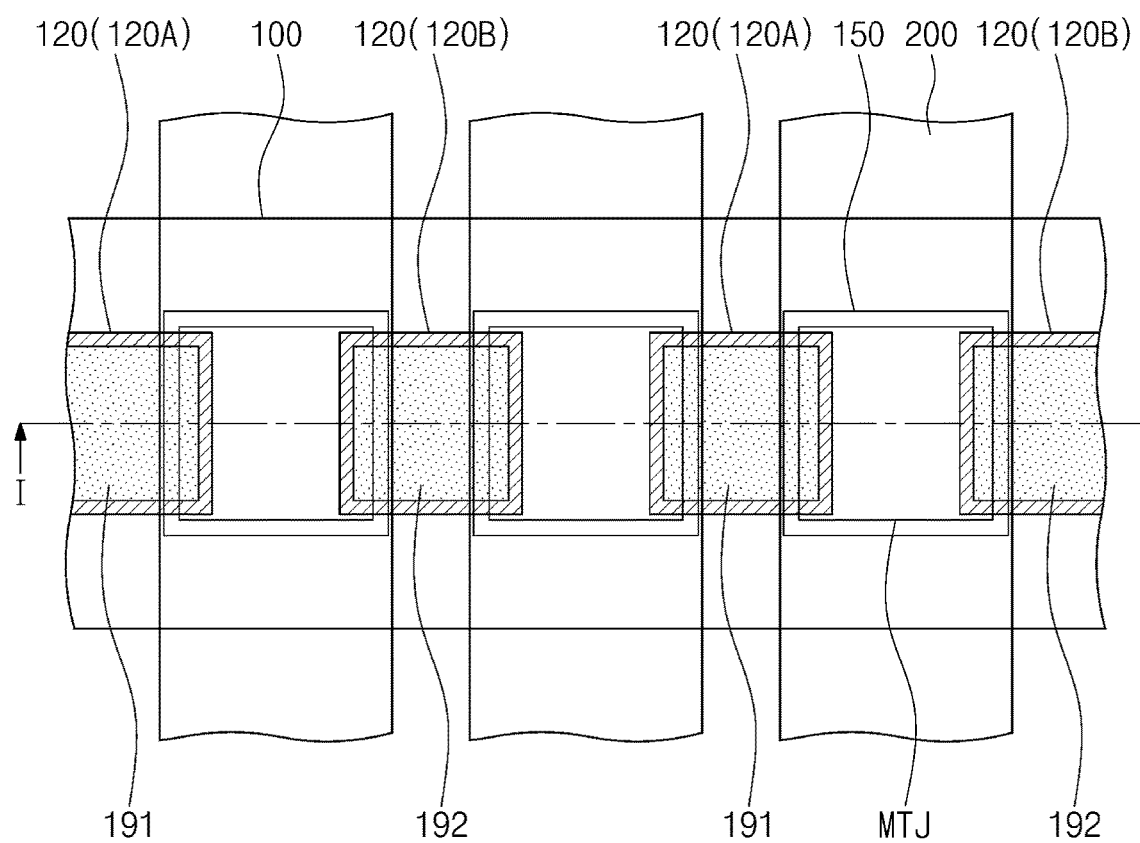
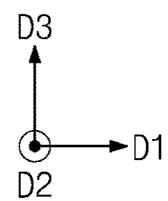

FIG. 7
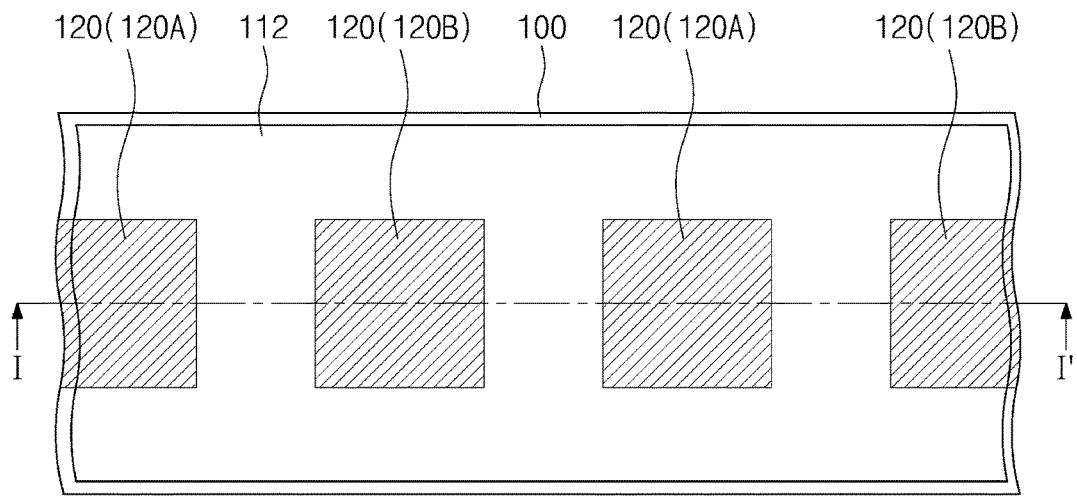
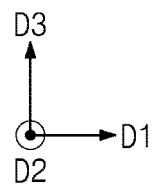
FIG. 8
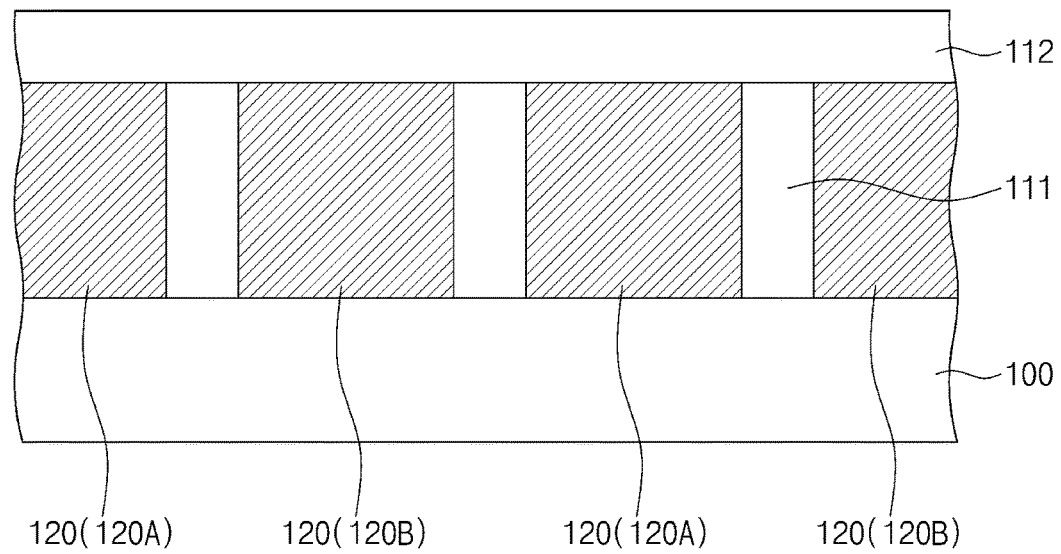
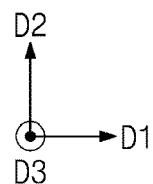

FIG. 11
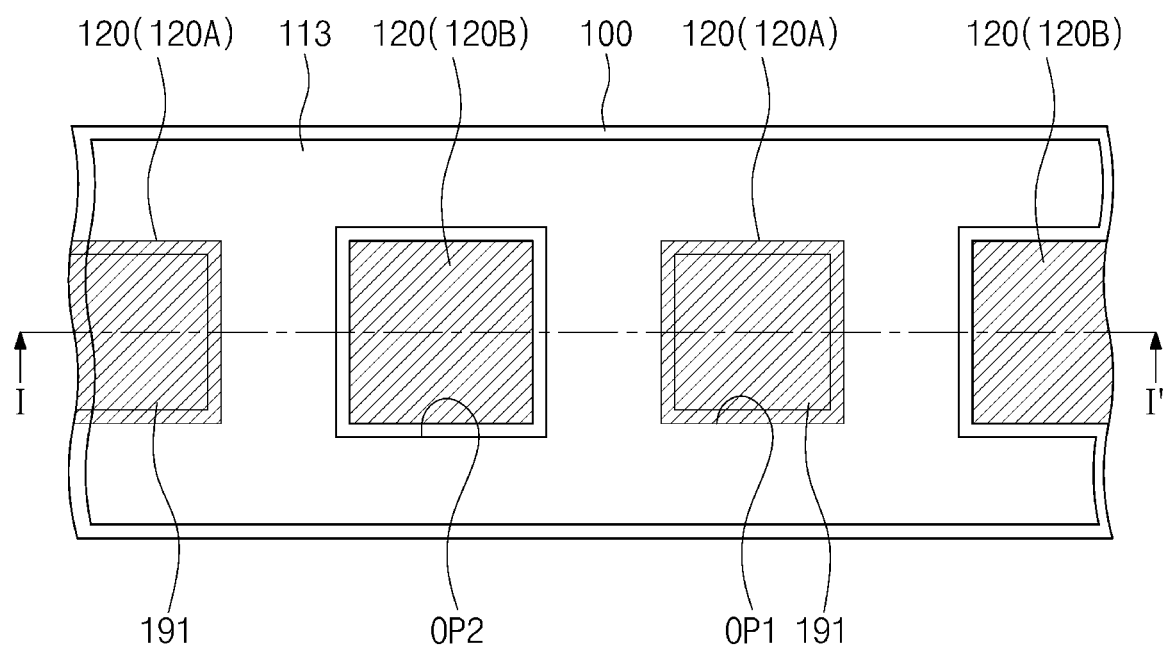
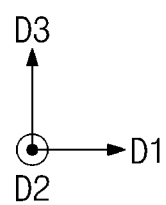

FIG. 13
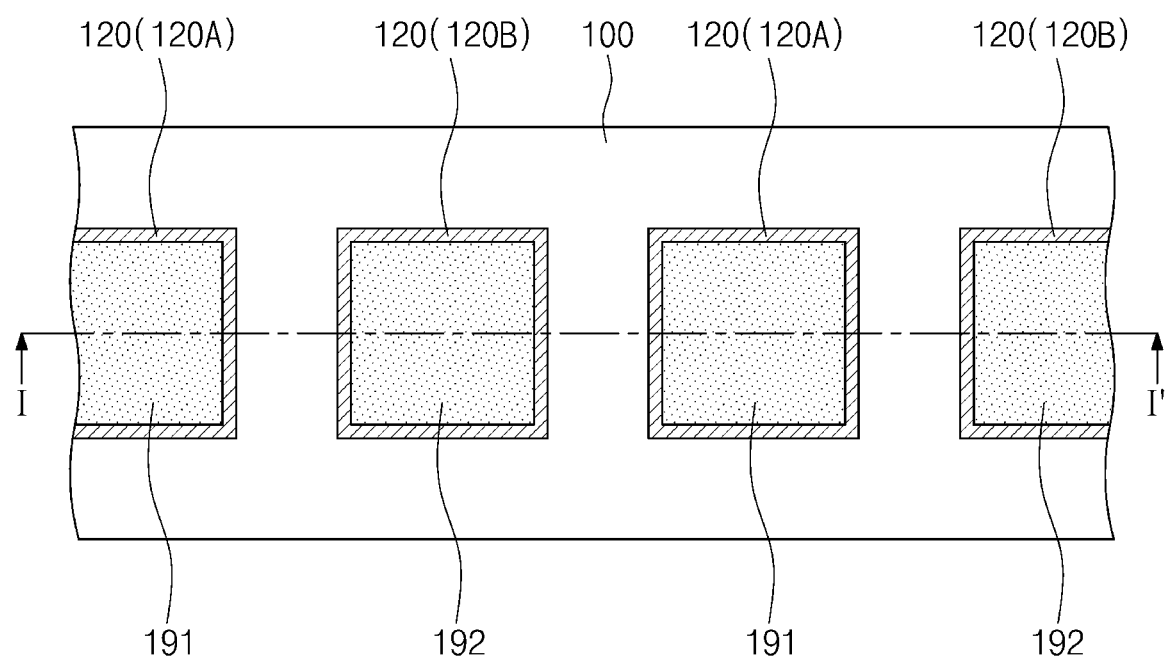
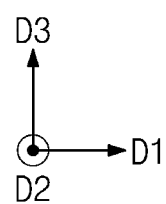

FIG. 23
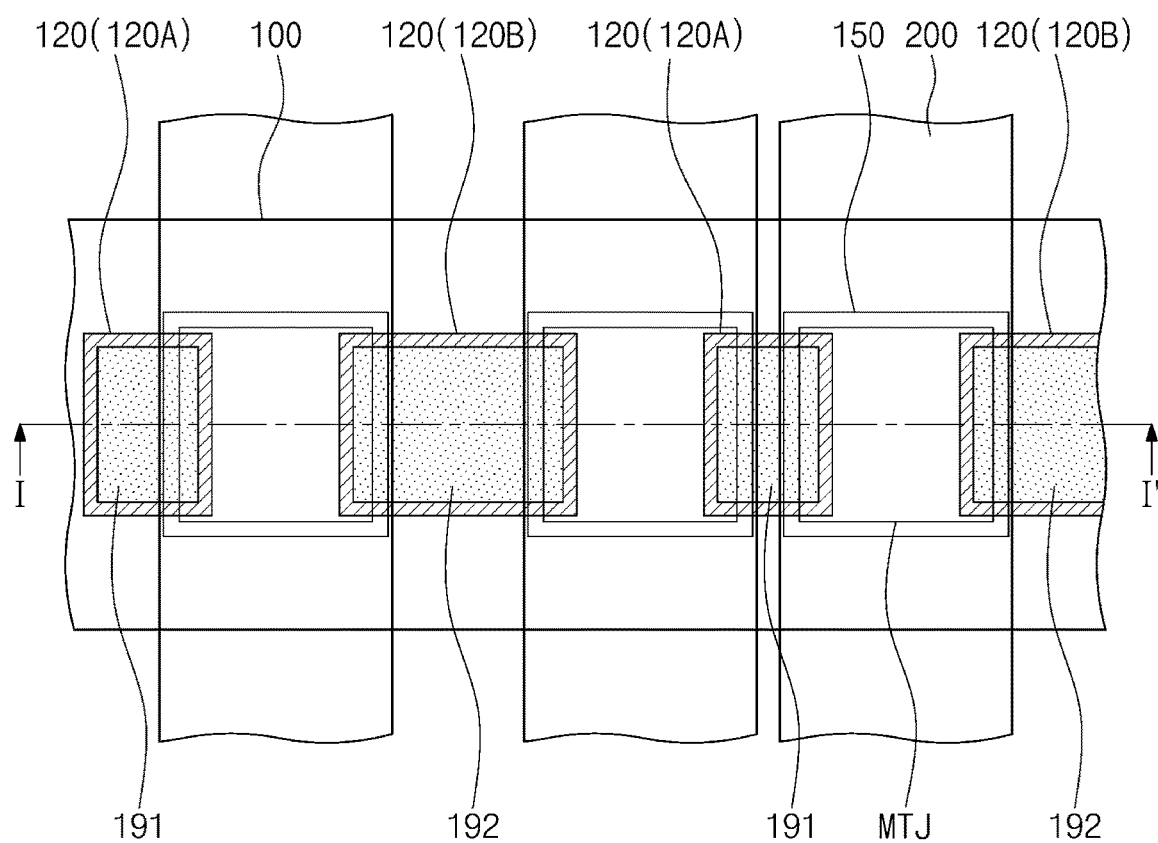
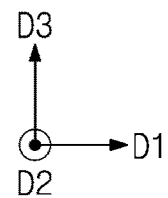

FIG. 26
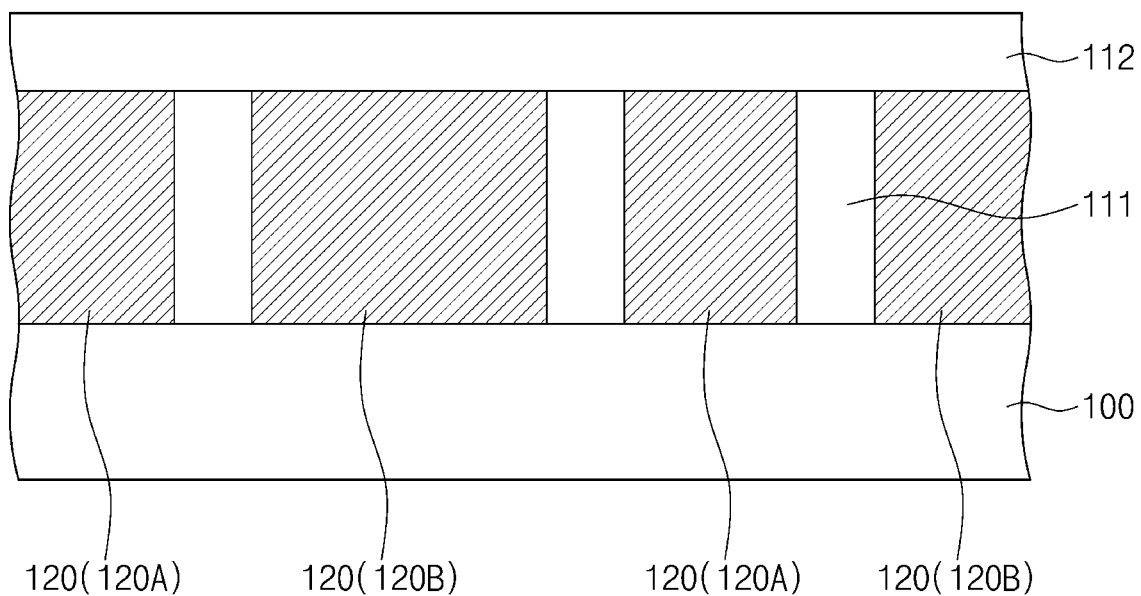
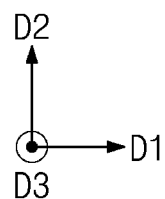

MAGNETIC MEMORY DEVICES

CROSS-REFERENCE TO RELATED APPLICATION

This U.S. non-provisional patent application claims priority under 35 U.S.C. § 119 to Korean Patent Application No. 10-2019-0113440, filed on Sep. 16, 2019, in the Korean Intellectual Property Office, the disclosure of which is hereby incorporated by reference in its entirety.

FIELD

Embodiments of the inventive concepts relate to semiconductor devices and, more particularly, to magnetic memory devices including magnetic tunnel junctions.

BACKGROUND

As demand for high-speed and/or low power consumption electronic devices has increased, so has demand for high-speed and/or low-voltage semiconductor memory devices used therein. Magnetic memory devices have been developed as semiconductor memory devices that may be capable of satisfying this demand. The magnetic memory devices may emerge as next-generation semiconductor memory devices because of their high-speed and/or non-volatile characteristics.

Generally, a magnetic memory device may include a magnetic tunnel junction (MTJ). The magnetic tunnel junction may include two magnetic layers and an insulating layer disposed between the two magnetic layers. A resistance value of the magnetic tunnel junction may be changed depending on magnetization directions of the two magnetic layers. The magnetic memory device may write/read data using a difference between the resistance values of the magnetic tunnel junction. Highly integrated and/or low-power magnetic memory devices have been increasingly demanded with the development of an electronic industry. Thus, various research is ongoing to satisfy this demand.

SUMMARY

Embodiments of the inventive concepts may provide magnetic memory devices capable of reducing a switching current.

Embodiments of the inventive concepts may also provide magnetic memory devices capable of allowing a magnetization direction of a free layer to be more easily aligned in a perpendicular direction after switching the free layer.

In some embodiments, a magnetic memory device may include a magnetic tunnel junction pattern on a substrate, a first conductive pattern between the substrate and the magnetic tunnel junction pattern, lower contact plugs between the first conductive pattern and the substrate and disposed at respective sides of the magnetic tunnel junction pattern, and second conductive patterns on the lower contact plugs, respectively. The second conductive patterns may connect the lower contact plugs to the first conductive pattern. The second conductive patterns may include a ferromagnetic material.

In some embodiments, a magnetic memory device may include magnetic tunnel junction patterns arranged along and spaced apart in a first direction on a substrate, first conductive patterns under bottom surfaces of the magnetic tunnel junction patterns, respectively, and lower conductive patterns between the substrate and the first conductive patterns. The lower conductive patterns may be disposed between the magnetic tunnel junction patterns in a plan view, and may connect adjacent ones of the first conductive patterns. The lower conductive patterns may include first lower conductive patterns and second lower conductive patterns, which are alternately arranged in the first direction. The first and second lower conductive patterns may have first and second magnetization directions, respectively, that are fixed in opposite directions to each other.

In some embodiments, a magnetic memory device may include magnetic tunnel junction patterns arranged along and spaced apart in a first direction on a substrate, first conductive patterns under bottom surfaces of the magnetic tunnel junction patterns, respectively, and second conductive patterns between the substrate and the first conductive patterns and including a ferromagnetic material. The second conductive patterns may be disposed between the magnetic tunnel junction patterns in a plan view, and may connect adjacent ones of the first conductive patterns. The second conductive patterns may include first patterns disposed at first sides of the first conductive patterns, and second patterns disposed at second sides of the first conductive patterns. A cross-sectional area of each of the second patterns may be greater than a cross-sectional area of each of the first patterns.

BRIEF DESCRIPTION OF THE DRAWINGS

The inventive concepts will become more apparent in view of the attached drawings and accompanying detailed description.

FIG. 1 is a plan view illustrating a magnetic memory device according to some embodiments of the inventive concepts.

FIGS. 7, 9, 11, 13, 15 and 17 are plan views illustrating a method of manufacturing a magnetic memory device, according to some embodiments of the inventive concepts.

FIGS. 8, 10, 12, 14, 16 and 18 are cross-sectional views taken along lines I-I' of FIGS. 7, 9, 11, 13, 15 and 17, respectively.

FIG. 23 is a plan view illustrating a magnetic memory device according to some embodiments of the inventive concepts.

FIGS. 26 and 28 are cross-sectional views taken along lines I-I' of FIGS. 25 and 27, respectively.

DETAILED DESCRIPTION OF THE EMBODIMENTS

Hereinafter, embodiments of the inventive concepts will be described in detail with reference to the accompanying drawings.

Figure 2:
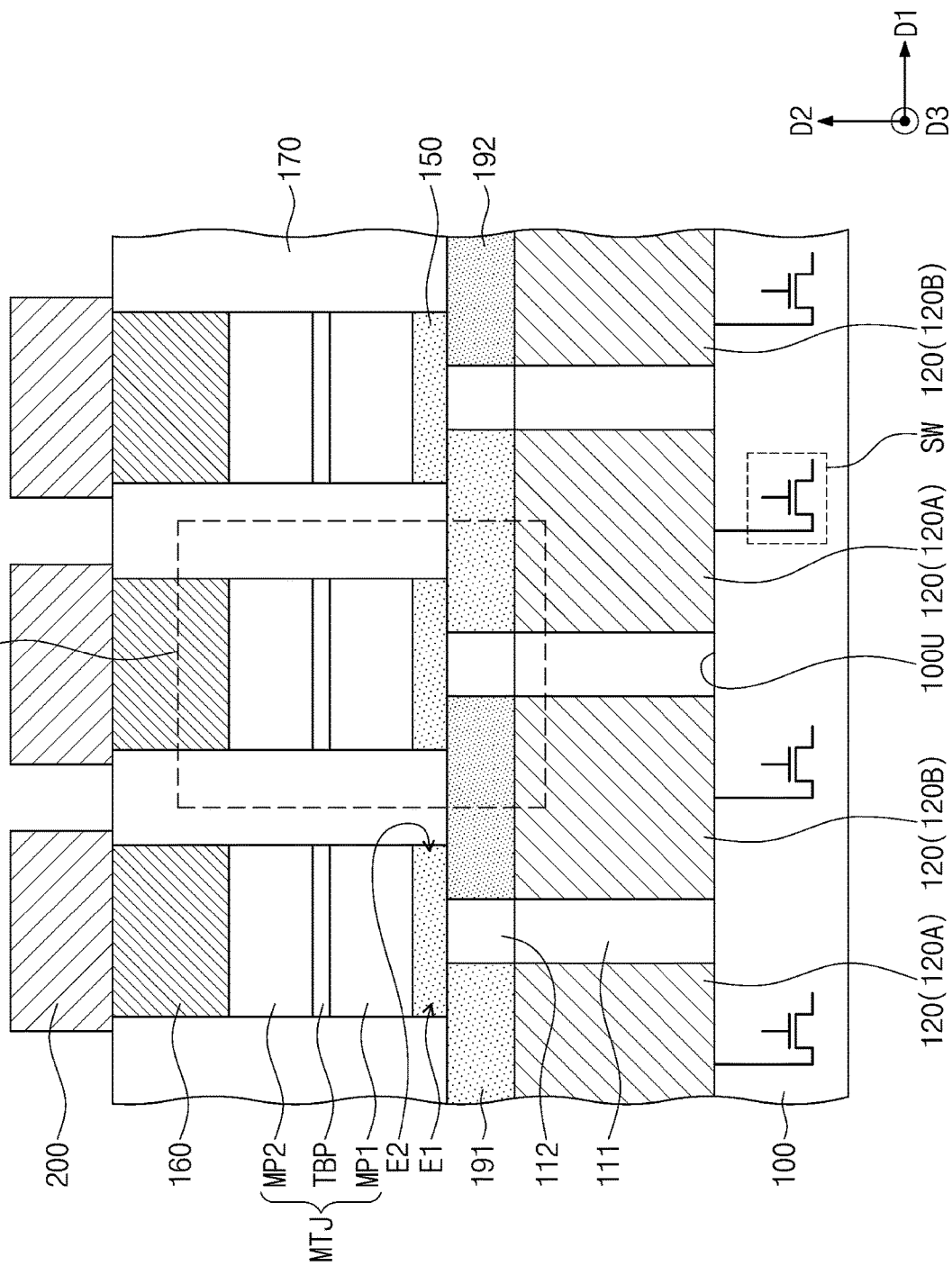
FIG. 2 is a cross-sectional view taken along a line I-I' of FIG. 1.
Figure 3:
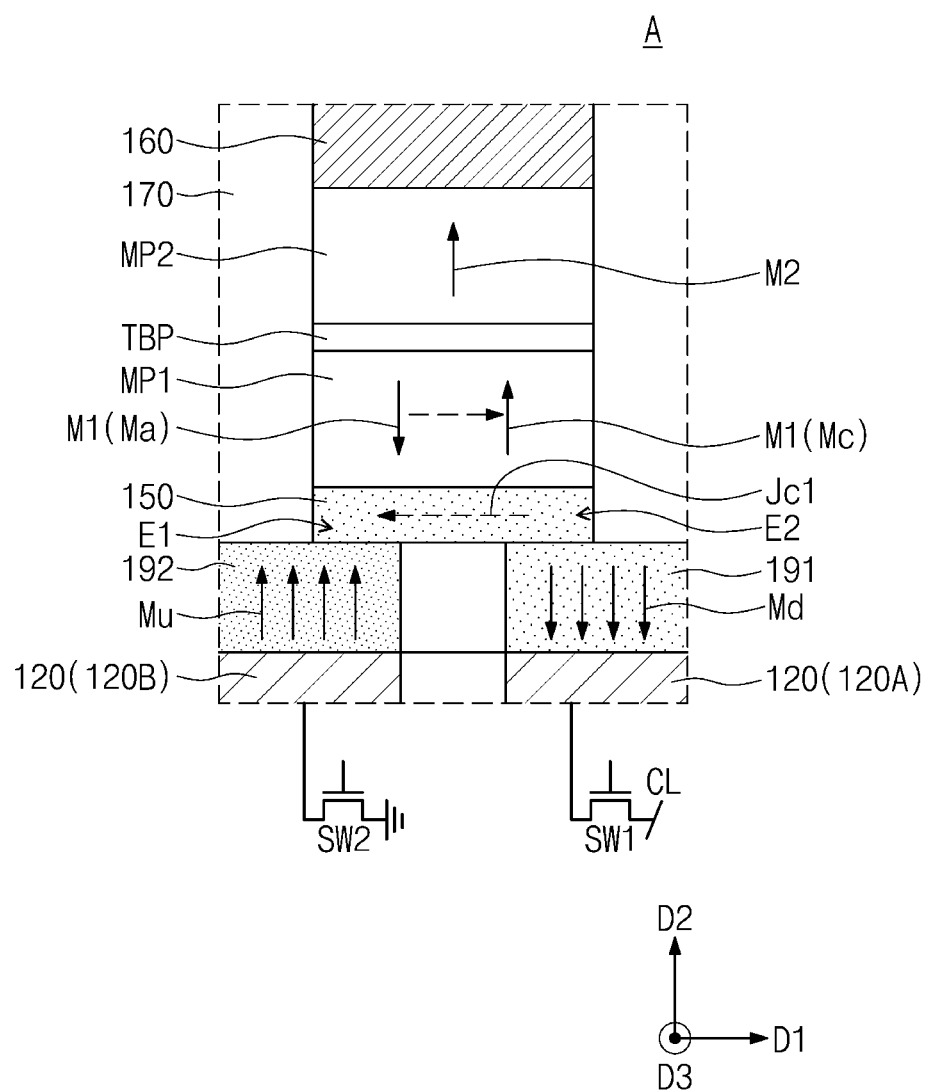
FIGS. 3 and 5 are enlarged views of a portion 'A' of FIG. 2.
Figure 4:
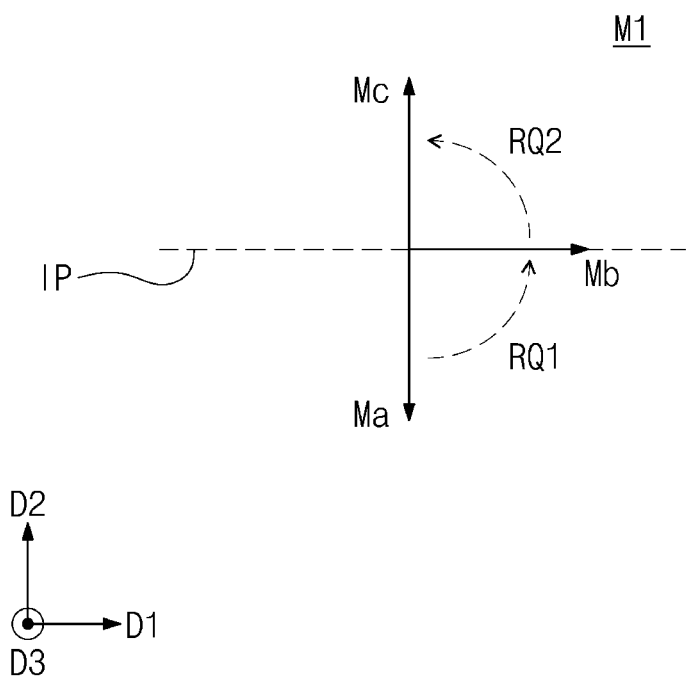
FIG. 4 is a conceptual diagram illustrating a change in a magnetization direction of a first magnetic pattern.
Figure 5:
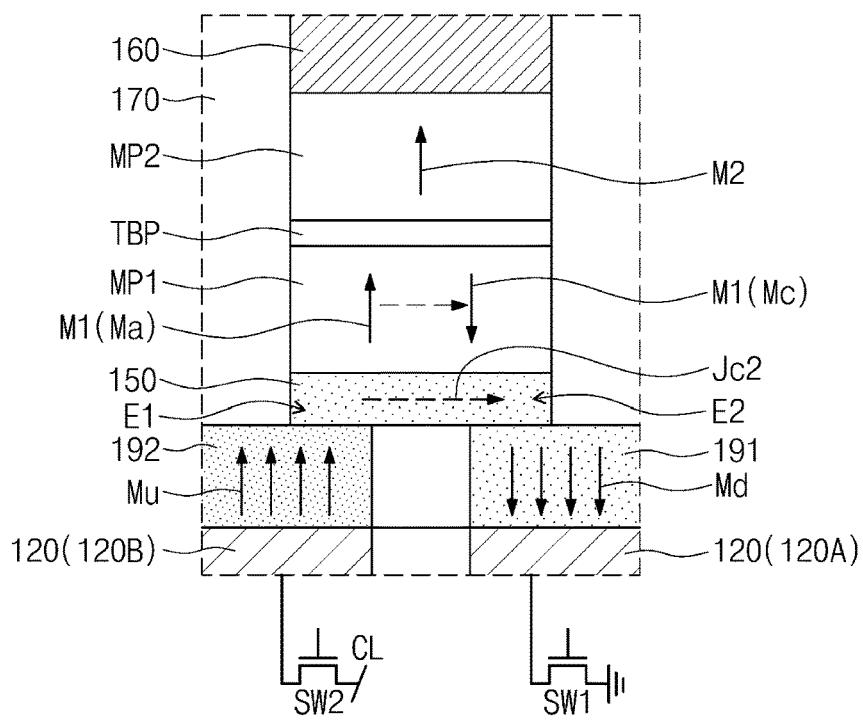

FIG. 1 is a plan view illustrating a magnetic memory device according to some embodiments of the inventive concepts. FIG. 2 is a cross-sectional view taken along a line I-I' of FIG. 1. FIGS. 3 and 5 are enlarged views of a portion 'A' of FIG. 2. FIG. 4 is a conceptual diagram illustrating a change in a magnetization direction of a first magnetic pattern. The terms first, second, etc. are used herein to distinguish elements, parameters, and/or operations from one another, rather than for purposes of limitation, and a first element discussed below could be termed a second element without departing from the scope of the present inventive concepts.

Referring to FIGS. 1 to 5, lower conductive patterns may be disposed on a substrate 100. In the present specification, the lower conductive patterns may refer to second conductive patterns to be described later or may refer to the second conductive patterns and lower contact plugs 120 disposed thereunder. Lower contact plugs 120 and a first interlayer insulating layer 111 between the lower contact plugs 120 may be disposed on the substrate 100. The substrate 100 may include a semiconductor substrate and selection elements SW formed on the semiconductor substrate. The semiconductor substrate may include silicon (Si), silicon on an insulator (SOI), silicon-germanium (SiGe), germanium (Ge), or gallium-arsenide (GaAs). The selection elements SW may be field effect transistors or diodes. Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures.

The lower contact plugs 120 may be laterally spaced apart from each other. The lower contact plugs 120 may be arranged to be spaced apart at intervals in a first direction D1 parallel to a top surface 100U of the substrate 100. For example, the lower contact plugs 120 may be arranged in the first direction D1 and a third direction D3. The third direction D3 may be parallel to the top surface 100U of the substrate 100 and may intersect the first direction D1. Odd-numbered lower contact plugs 120 of the lower contact plugs 120 arranged in the first direction D1 may be referred to as first lower contact plugs 120A, and even-numbered lower contact plugs 120 thereof may be referred to as second lower contact plugs 120B. In other words, the first lower contact plugs 120A and the second lower contact plugs 120B may be alternately arranged or alternating in the first direction D1.

Each of the lower contact plugs 120 may be connected to one terminal of a corresponding one of the selection elements SW. As used herein, the term "connected" may refer to physical and/or electrical connection. The lower contact plugs 120 may include a doped semiconductor material (e.g., doped silicon), a metal (e.g., tungsten, titanium, or tantalum), a conductive metal nitride (e.g., titanium nitride, tantalum nitride, or tungsten nitride), and/or a metal-semiconductor compound (e.g., a metal silicide). The lower contact plugs 120 may be electrically isolated from each other by the first interlayer insulating layer 111. The first interlayer insulating layer 111 may include an oxide layer, a nitride layer, and/or an oxynitride layer.

Second conductive patterns 191 and 192 may be provided on the lower contact plugs 120, respectively. The second conductive patterns 191 and 192 may be disposed in a second interlayer insulating layer 112 provided on the first interlayer insulating layer 111. The second interlayer insulating layer 112 may include an oxide layer, a nitride layer, and/or an oxynitride layer. The second conductive patterns 191 and 192 may include first patterns 191 on the first lower contact plugs 120A and second patterns 192 on the second lower contact plugs 120B. Sidewalls of the second conductive patterns 191 and 192 may be aligned with sidewalls of the lower contact plugs 120. Thicknesses of the second conductive patterns 191 and 192 may be less than thicknesses of the lower contact plugs 120. Each of the second conductive patterns 191 and 192 may have substantially the same shape as the lower contact plug 120 disposed thereunder when viewed in a plan view.

Magnetic tunnel junction patterns MTJ may be disposed on the second interlayer insulating layer 112 and may be laterally spaced apart from each other. The magnetic tunnel junction patterns MTJ may be arranged to be spaced apart at intervals in the first direction D1. Each of the magnetic tunnel junction patterns MTJ may be disposed on the second interlayer insulating layer 112 between a pair of the lower contact plugs 120 that are immediately adjacent to each other. Respective pairs of lower contact plugs 120 may be disposed at both (e.g., opposing) sides of each of the magnetic tunnel junction patterns MTJ, and between immediately adjacent magnetic tunnel junction patterns MTJ. Each of the magnetic tunnel junction patterns MTJ may include a first magnetic pattern MP1, a tunnel barrier pattern TBP and a second magnetic pattern MP2, which are sequentially stacked in a second direction D2 intersecting (e.g., perpendicular to) the first and third directions D1 and D3. The tunnel barrier pattern TBP may be disposed between the first magnetic pattern MP1 and the second magnetic pattern MP2. For example, the tunnel barrier pattern TBP may include a magnesium oxide (MgO) layer, a titanium oxide (TiO) layer, an aluminum oxide (AlO) layer, a magnesium-zinc oxide (MgZnO) layer, and/or a magnesium-boron oxide (MgBO) layer. Each of the first and second magnetic patterns MP1 and MP2 may include at least one magnetic layer.

As illustrated in FIGS. 3 and 5, the second magnetic pattern MP2 may include a reference layer having a magnetization direction M2 fixed in one direction, and the first magnetic pattern MP1 may include a free layer having a magnetization direction M1 changeable to be parallel or anti-parallel to the magnetization direction M2 of the reference layer. In some embodiments, as illustrated in FIG. 3, the magnetization directions M1 and M2 may be substantially perpendicular to an interface between the tunnel barrier pattern TBP and the first magnetic pattern MP. In this case, each of the reference layer and the free layer may include a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, and/or a perpendicular magnetic structure. The perpendicular magnetic material having the L1$_0$ structure may include FePt having the L1$_0$ structure, FePd having the L1$_0$ structure, CoPd having the L1$_0$ structure, and/or CoPt having the L1 structure. The perpendicular magnetic structure may include magnetic layers and non-magnetic layers, which are alternately and repeatedly stacked. For example, the perpendicular magnetic structure may include (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n, where "n" denotes the number of bilayers. Here, the reference layer may be thicker than the free layer, and/or a coercive force of the reference layer may be greater than a coercive force of the free layer.

Electrode patterns 160 may be disposed on the magnetic tunnel junction patterns MTJ, respectively. The first magnetic pattern MP1 may be disposed between the second interlayer insulating layer 112 and the tunnel barrier pattern TBP, and the second magnetic pattern MP2 may be disposed between each of the electrode patterns 160 and the tunnel barrier pattern TBP. For example, the electrode patterns 160 may include a metal (e.g., Ta, W, Ru, or Ir) and/or a conductive metal nitride (e.g., TiN).

First conductive patterns 150 may be disposed under the magnetic tunnel junction patterns MTJ, respectively. A pair of the second conductive patterns 191 and 192 adjacent to each of the magnetic tunnel junction patterns MTJ may be connected to both end portions of each of the first conductive patterns 150, respectively. For example, the first pattern 191 may be connected to one end portion E1 of the first conductive pattern 150, and the second pattern 192 may be connected to another end portion E2 of the first conductive pattern 150. The one end portion E1 and the other end portion E2 may be spaced apart from each other in the first direction D1. One end portion of each of the second conductive patterns 191 and 192 may be connected to one of the first conductive patterns 150, and another end portion thereof may be connected to another of the first conductive patterns 150. Bottom surfaces of the first conductive patterns 150 may be in contact with a top surface of the second interlayer insulating layer 112.

The first conductive patterns 150 and the second conductive patterns 191 and 192 may be alternately arranged in the first direction D1. Each of the second conductive patterns 191 and 192 may be disposed between the magnetic tunnel junction patterns MTJ in a plan view and may connect the first conductive patterns 150 immediately adjacent to each other.

A third interlayer insulating layer 170 may be disposed on the second conductive patterns 191 and 192 to cover the magnetic tunnel junction patterns MTJ and the electrode patterns 160. For example, the third interlayer insulating layer 170 may cover sidewalls of the magnetic tunnel junction patterns MTJ and the electrode patterns 160. The third interlayer insulating layer 170 may include an oxide layer, a nitride layer, and/or an oxynitride layer. Upper conductive lines 200 may be disposed on the third interlayer insulating layer 170. The upper conductive lines 200 may be connected to the magnetic tunnel junction patterns MTJ, respectively. Each of the upper conductive lines 200 may be electrically connected to a corresponding one of the magnetic tunnel junction patterns MTJ through a corresponding one of the electrode patterns 160. For example, the upper conductive lines 200 may extend in the third direction D3 and may be spaced apart from each other in the first direction D1.

Each of the upper conductive lines 200 may extend in the third direction D3 and may be connected to a plurality of the electrode patterns 160 and the magnetic tunnel junction patterns MTJ thereunder. The upper conductive lines 200 may include a metal (e.g., copper) and/or a conductive metal nitride. The upper conductive lines 200 may be used as bit lines.

FIG. 3 illustrates a first in-plane current Jc1 that flows through the first conductive pattern 150 in a direction opposite to the first direction D1. FIG. 4 is a conceptual diagram illustrating a change in the magnetization direction M1 of the first magnetic pattern MP1. In the present specification, the term 'in-plane' may mean a direction parallel to a specific surface of a corresponding component and may mean a direction parallel to the top surface 100U of the substrate 100 and/or a direction parallel to the interface between the tunnel barrier pattern TBP and the first magnetic pattern MP1, unless otherwise defined. Likewise, 'a perpendicular direction' may mean a direction (e.g., the second direction D2 or a direction opposite to the second direction D2) perpendicular to the top surface 100U of the substrate 100 and/or a direction perpendicular to the interface between the tunnel barrier pattern TBP and the first magnetic pattern MP1, unless otherwise defined.

A current provided from a first selection element SW1 connected to an interconnection line CL may sequentially pass through the first lower contact plug 120A, the first pattern 191, the first conductive pattern 150, the second pattern 192, and the second lower contact plug 120B and then may be transmitted to a second selection element SW2. In this case, electrons may move from the second selection element SW2 to the first selection element SW1 through a path opposite to the above path.

The first conductive patterns 150 may be configured to apply spin-orbit torque to the magnetic tunnel junction patterns MTJ. The first conductive patterns 150 may be configured to have strong spin-orbit interaction. The first in-plane current Jc1 flowing through the first conductive pattern 150 may cause accumulation of spin-polarized charge carriers (e.g., electrons) near the magnetic tunnel junction pattern MTJ by the spin-orbit interaction in the first conductive pattern 150. A spin-orbit field may be generated by the accumulated charge carriers. The spin-orbit field may be in-plane of the first conductive pattern 150 and may be perpendicular to a direction of the in-plane current flowing through the first conductive pattern 150. For example, the first in-plane current Jc1 may flow in the direction opposite to the first direction D1, and the spin-orbit field may be parallel to the third direction D3. The spin-orbit field generated in the first conductive pattern 150 may apply the spin-orbit torque to the magnetic tunnel junction pattern MTJ (more particularly, the magnetization direction M1 of the first magnetic pattern MP1). Thus, an initial magnetization direction Ma of the first magnetic pattern MP1 may be switched to a final magnetization direction Mc opposite to the initial magnetization direction Ma by using the spin-orbit torque. In FIG. 3, the initial magnetization direction Ma may be the direction opposite to the second direction D2, and the final magnetization direction Mc may be the second direction D2.

The first in-plane current Jc1 and the spin-orbit field generated thereby may have components in an in-plane direction, which are stronger than components in the perpendicular direction (e.g., the second direction D2 or the direction opposite to the second direction D2). Thus, the initial magnetization direction Ma of the first magnetic pattern MP1 may be relatively easily changed into a middle magnetization direction Mb, which is in-plane, e.g., parallel to a bottom surface IP of the first magnetic pattern MP1, by first torque RQL. Torque in the perpendicular direction may be required to change the middle magnetization direction Mb into the final magnetization direction Mc. However, the first in-plane current Jc1 and the spin-orbit field generated thereby may have the strong components in the in-plane direction as described above, and thus the change into the final magnetization direction Mc may not be easy. Accordingly, non-deterministic switching in which a final magnetization direction is not accurately determined may occur.

According to some embodiments of the inventive concepts, the second conductive patterns 191 and 192 may have magnetization directions Mu and Md perpendicular to the top surface 100U of the substrate 100, thereby enhancing a perpendicular component of second torque RQ2 for changing the middle magnetization direction Mb into the final magnetization direction Mc. The enhancement of the perpendicular component of the second torque RQ2 may be due to spin filtering at interfaces between the first conductive pattern 150 of a non-magnetic pattern and the second conductive patterns 191 and 192 having the perpendicular magnetization directions. For example, the second pattern 192 may have the perpendicular magnetization direction Mu fixed in the second direction D2, and thus spin directions of the electrons transmitted into the second pattern 192 through the second lower contact plug 120B may be aligned in the second direction D2. The perpendicular component of the second torque RQ2 may be enhanced by the spin directions of the electrons which are aligned in the second direction D2, and thus the middle magnetization direction Mb may be more easily changed into the final magnetization direction Mc. In other words, deterministic switching capable of accurately determining the final magnetization direction may be performed.

FIG. 5 illustrates a second in-plane current Jc2 that flows through the first conductive pattern 150 in the first direction D1. A current provided from the second selection element SW2 connected to an interconnection line CL may sequentially pass through the second lower contact plug 120B, the second pattern 192, the first conductive pattern 150, the first pattern 191, and the first lower contact plug 120A and then may be transmitted to the first selection element SW1. In this case, electrons may move from the first selection element SW1 to the second selection element SW2 through a path opposite to the above path. Like the descriptions of FIGS. 3 and 4, the first pattern 191 may have the perpendicular magnetization direction Md fixed in the direction opposite to the second direction D2, and thus spin directions of the electrons transmitted into the first pattern 191 through the first lower contact plug 120A may be aligned in the direction opposite to the second direction D2. The perpendicular component of the second torque RQ2 may be enhanced by the spin directions of the electrons which are aligned in the direction opposite to the second direction D2, and thus an initial magnetization direction Ma of the second direction D2 may be more easily changed into a final magnetization direction Mc having the direction opposite to the second direction D2.

Figure 6:
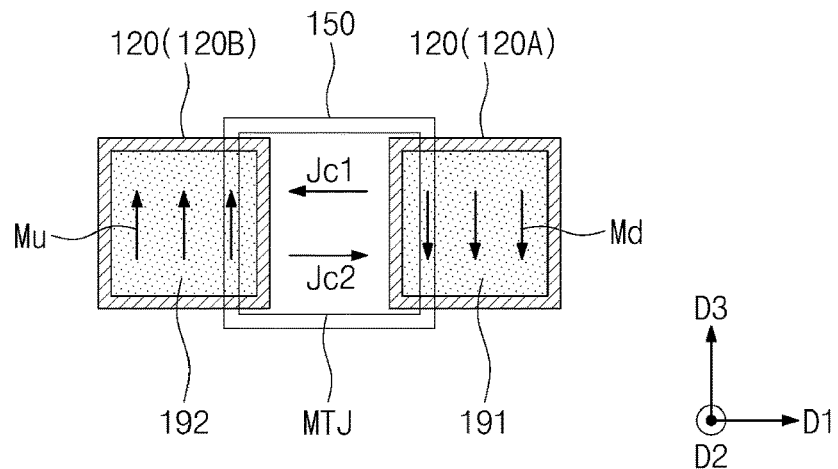
FIG. 6 is a plan view illustrating a magnetic memory device according to some embodiments of the inventive concepts.

FIG. 6 is a plan view illustrating a magnetic memory device according to some embodiments of the inventive concepts. Hereinafter, the descriptions to the same components and features as in the above embodiments will be omitted for ease of explanation.

Referring to FIG. 6, magnetization directions of the first and second magnetic patterns MP1 and MP2 of the magnetic tunnel junction pattern MTJ may be perpendicular to the top surface 100U of the substrate 100, as described with reference to FIGS. 3 and 5. The second in-plane current Jc2 in the first direction D1 or the first in-plane current Jc1 in the direction opposite to the first direction D1 may flow in the first conductive pattern 150 through the first lower contact plug 120A and the second lower contact plug 120B.

In the present embodiment, each of the second conductive patterns 191 and 192 may have a magnetization direction fixed in a horizontal direction, i.e., the in-plane direction. The magnetization direction of each of the second conductive patterns 191 and 192 may be fixed in a direction perpendicular to a direction in which the first pattern 191 is spaced apart from the second pattern 192. In other words, the magnetization direction of each of the second conductive patterns 191 and 192 may be fixed in a direction perpendicular to the flowing directions of the in-plane currents Jc1 and Jc2. For example, the second pattern 192 may have a magnetization direction Mu fixed in the third direction D3, and the first pattern 191 may have a magnetization direction Md fixed in a direction opposite to the third direction D3.

Spin directions of electrons transmitted into the second pattern 192 through the second lower contact plug 120B may be aligned in the third direction D3 by the magnetization direction Mu of the second pattern 192 which is fixed in the third direction D3. A component, in the third direction D3 (i.e., a direction perpendicular to the in-plane current), of the second torque RQ2 described with reference to FIG. 4 may be enhanced by the spin directions of the electrons which are aligned in the third direction D3, and this may induce the middle magnetization direction Mb to be more easily changed into the final magnetization direction Mc.

Likewise, spin directions of electrons transmitted into the first pattern 191 through the first lower contact plug 120A may be aligned in the opposite direction of the third direction D3 by the magnetization direction Md of the first pattern 191 which is fixed in the opposite direction of the third direction D3. A component, in the opposite direction of the third direction D3 (i.e., a direction perpendicular to the in-plane current), of the second torque RQ2 described with reference to FIG. 4 may be enhanced by the spin directions of the electrons which are aligned in the opposite direction of the third direction D3, and this may induce the middle magnetization direction Mb to be more easily changed into the final magnetization direction Mc.

Referring again to FIGS. 1 and 2, the first conductive patterns 150 may include a heavy metal or a material doped with a heavy metal. For example, the first conductive patterns 150 may include 'A' and/or 'M' doped with 'B'. The 'A' may include yttrium (Y), zirconium (Zr), niobium (Nb), molybdenum (Mo), technetium (Tc), ruthenium (Ru), rhodium (Rh), palladium (Pd), cadmium (Cd), indium (In), antimony (Sb), tellurium (Te), hafnium (Hf), tantalum (Ta, including high-resistance amorphous β-Ta), tungsten (W), rhenium (Re), osmium (Os), iridium (Ir), platinum (Pt), gold (Au), mercury (Hg), thallium (Tl), lead (Pb), bismuth (Bi), polonium (Po), astatine (At), and/or any combination thereof. The 'B' may include vanadium (V), chromium (Cr), manganese (Mn), iron (Fe), cobalt (Co), nickel (Ni), phosphorus (P), sulfur (S), zinc (Zn), gallium (Ga), germanium (Ge), arsenic (As), selenium (Se), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), antimony (Sb), tellurium (Te), iodine (I), lutetium (Lu), hafnium (Hf), tantalum (Ta), tungsten (W), rhenium (Re), osmium (Os), iridium (Ir), platinum (Pt), gold (Au), mercury (Hg), thallium (Tl), lead (Pb), bismuth (Bi), polonium (Po), astatine (At), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), and/or ytterbium (Yb). The 'M' may include aluminum (Al), titanium (Ti), vanadium (V), chromium (Cr), manganese (Mn), copper (Cu), zinc (Zn), silver (Ag), hafnium (Hf), tantalum (Ta), tungsten (W), rhenium (Re), platinum (Pt), gold (Au), mercury (Hg), lead (Pb), silicon (Si), gallium (Ga), gallium-manganese (GaMn), and/or gallium-arsenide (GaAs). For example, the first conductive patterns 150 may include copper (Cu) doped with iridium (Ir), and/or copper (Cu) doped with bismuth (Bi).

According to some embodiments, the second conductive patterns 191 and 192 may be ferromagnetic patterns and may include a ferromagnetic material. In some embodiments, the magnetization directions Mu and Md of the second conductive patterns 191 and 192 may be substantially perpendicular to the interface between the tunnel barrier pattern TBP and the first magnetic pattern MP1. In this case, the second conductive patterns 191 and 192 may include a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, and/or a perpendicular magnetic structure. The perpendicular magnetic material having the $L1_0$ structure may include FePt having the $L1_0$ structure, FePd having the $L1_0$ structure, CoPd having the $L1_0$ structure, and/or CoPt having the L1 structure. The perpendicular magnetic structure may include magnetic layers and non-magnetic layers, which are alternately and repeatedly stacked. For example, the perpendicular magnetic structure may include (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n, where "n" denotes the number of bilayers. Here, the second conductive patterns 191 and 192 may be thicker than the free layer (i.e., the first magnetic pattern MP1), and/or a coercive force of the second conductive patterns 191 and 192 may be greater than a coercive force of the first magnetic pattern MP1.

In certain embodiments, as illustrated in FIG. 6, the magnetization directions Mu and Md of the second conductive patterns 191 and 192 may be substantially parallel to the interface between the tunnel barrier pattern TBP and the first magnetic pattern MP1. In this case, the second conductive patterns 191 and 192 may further include an anti-ferromagnetic material for fixing a magnetization direction of a ferromagnetic material.

A coercive force of the first patterns 191 may be greater than a coercive force of the second patterns 192. For example, the first patterns 191 may include at least one of the aforementioned materials, a coercive force of which is greater than the coercive force of the second patterns 192. In this case, the first patterns 191 may include a different material from that of the second patterns 192.

According to the embodiments of the inventive concepts, the first conductive pattern 150 may more easily switch the magnetization direction of the first magnetic pattern MP corresponding to the free layer by the second conductive patterns 191 and 192. The second conductive patterns 191 and 192 may assist a final magnetization direction of the free layer to be perpendicularly aligned, and thus a spin current for switching of the magnetic memory device may be reduced.

FIGS. 7, 9, 11, 13, 15 and 17 are plan views illustrating a method of manufacturing a magnetic memory device, according to some embodiments of the inventive concepts. FIGS. 8, 10, 12, 14, 16 and 18 are cross-sectional views taken along lines I-I' of FIGS. 7, 9, 11, 13, 15 and 17, respectively. Hereinafter, the descriptions to the same technical features as in the embodiments of FIGS. 1 to 6 will be omitted or mentioned briefly for ease of explanation. Selection elements are omitted for ease of illustration.

Referring to FIGS. 7 and 8, a first interlayer insulating layer 111 may be formed on a substrate 100. The substrate 100 may include a semiconductor substrate and selection elements (see SW of FIG. 2) formed on the semiconductor substrate. Lower contact plugs 120 may be formed in the first interlayer insulating layer 111. In some embodiments, the formation of the lower contact plugs 120 may include forming lower contact holes penetrating the first interlayer insulating layer 111, and forming the lower contact plugs 120 in the lower contact holes, respectively. Each of the lower contact plugs 120 may be connected to one terminal of a corresponding one of the selection elements.

A second interlayer insulating layer 112 may be formed to cover the lower contact plugs 120. The second interlayer insulating layer 112 may be in contact with top surfaces of the lower contact plugs 120.

Figure 9:
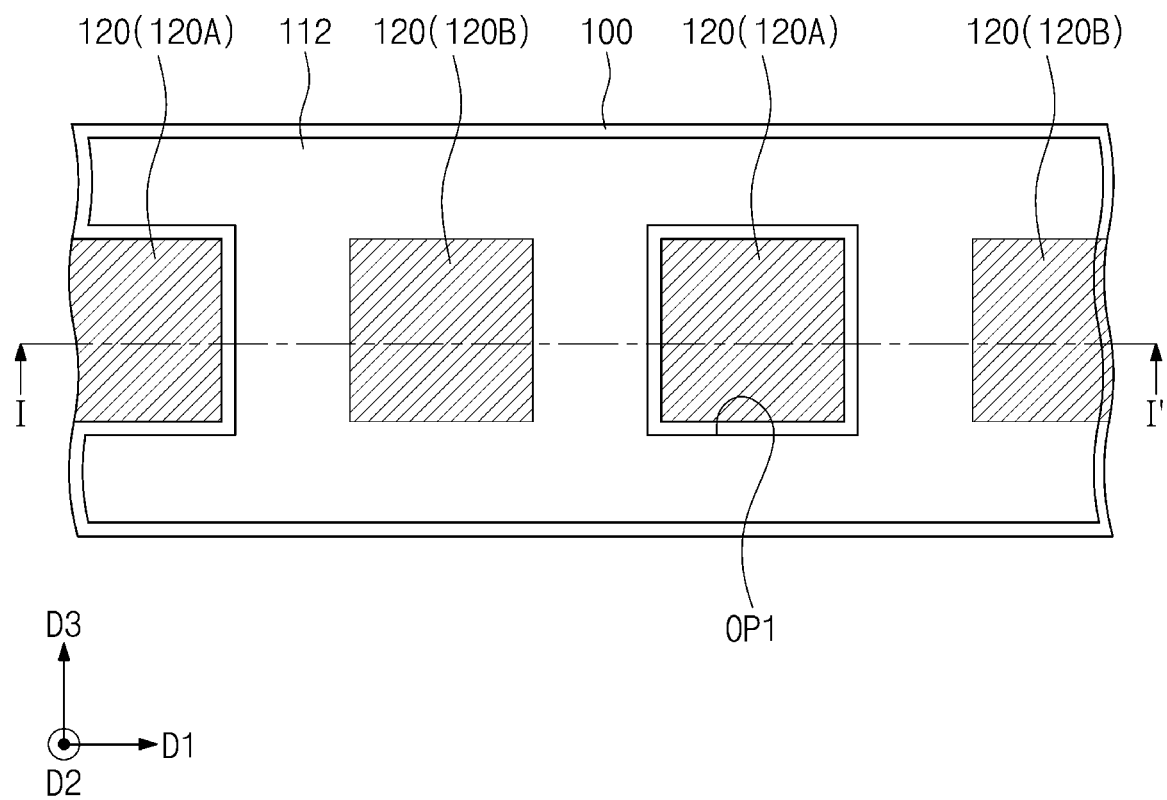
Figure 10:
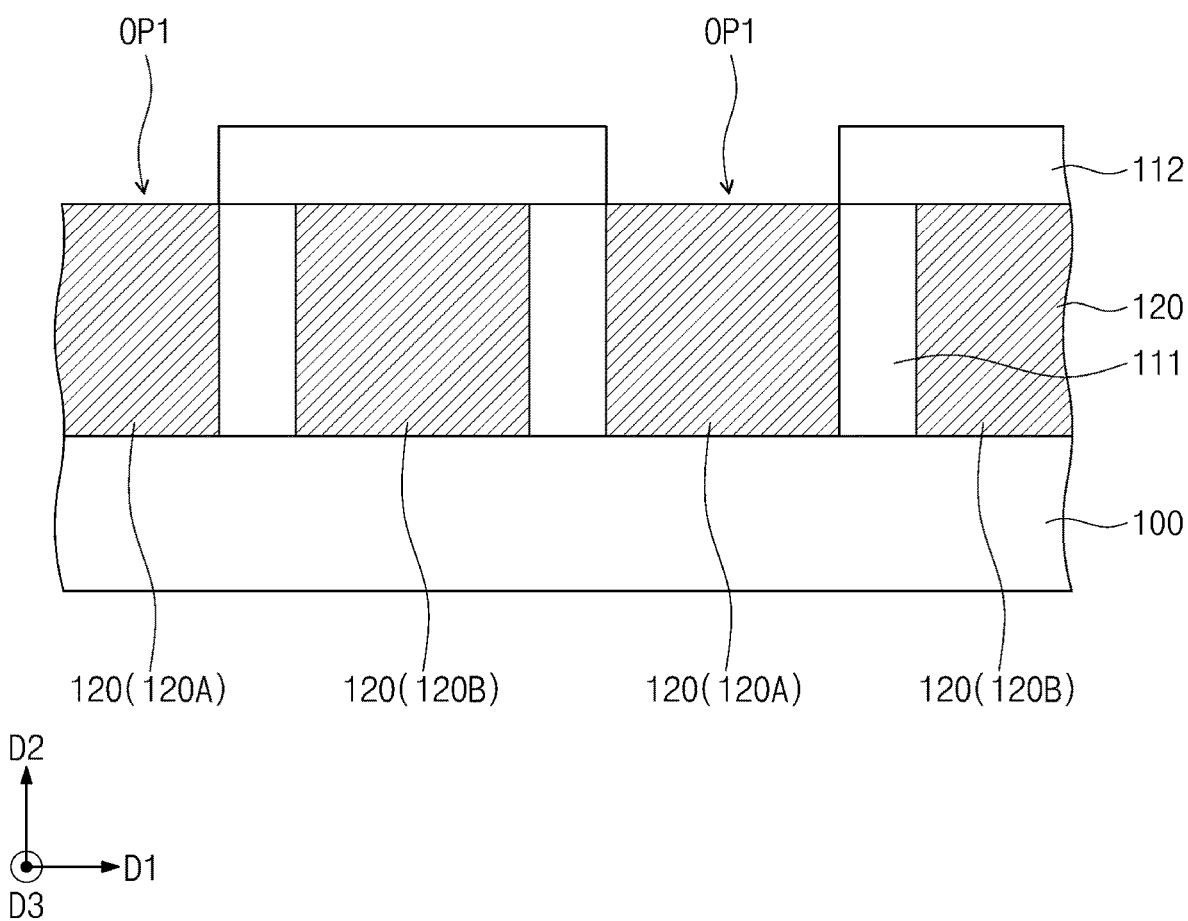

Referring to FIGS. 9 and 10, first openings OP1 may be formed to penetrate and extend through the second interlayer insulating layer 112. The first openings OP1 may expose the first lower contact plugs 120A. The first openings OP1 may have planar shapes similar to planar shapes of the first lower contact plugs 120A. However, embodiments of the inventive concepts are not limited thereto. The top surfaces of the second lower contact plugs 120B may not be exposed but may be covered by the second interlayer insulating layer 112. In certain embodiments, the first openings OP1 may be formed by recessing upper portions of the lower contact plugs 120 (e.g., selectively recessing upper portions of lower contact plugs 120A) without the formation of the second interlayer insulating layer 112.

Figure 12:
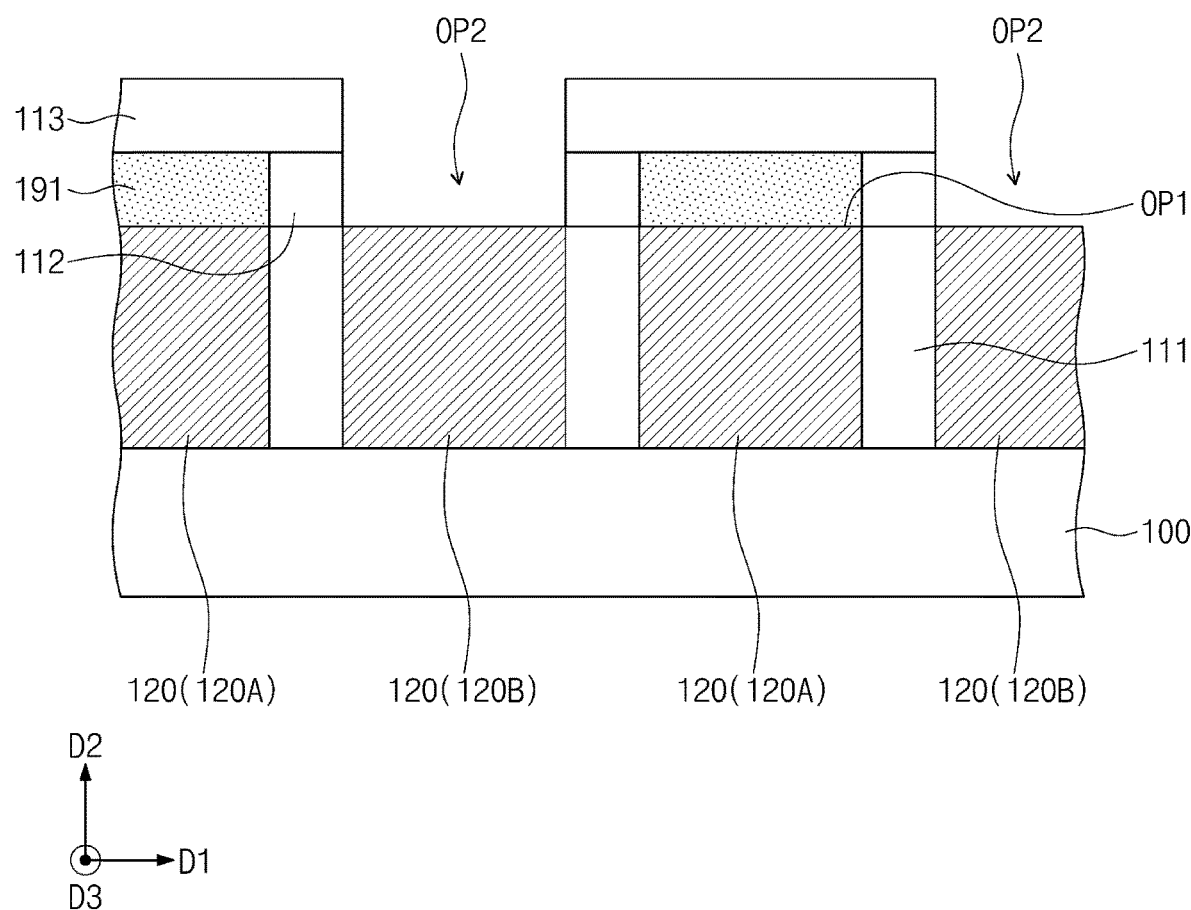

Referring to FIGS. 11 and 12, first patterns 191 may be formed to fill the first openings OP1, respectively. A process of forming the first patterns 191 may include depositing a ferromagnetic material to fill the first openings OP1, and performing a planarization process on the deposited ferromagnetic material until a top surface of the second interlayer insulating layer 112 is exposed. The process of forming the first patterns 191 may include aligning magnetization directions of the first patterns 191 by a first external magnetic field. For example, the first patterns 191 may have the magnetization directions Md fixed in the direction opposite to the second direction D2 by the aligning process, as illustrated in FIG. 3.

A mask layer 113 covering the first patterns 191 may be formed on the second interlayer insulating layer 112. Second openings OP2 exposing the second lower contact plugs 120B may be formed in the mask layer 113. The second openings OP2 may penetrate and extend through the second interlayer insulating layer 112.

Figure 14:
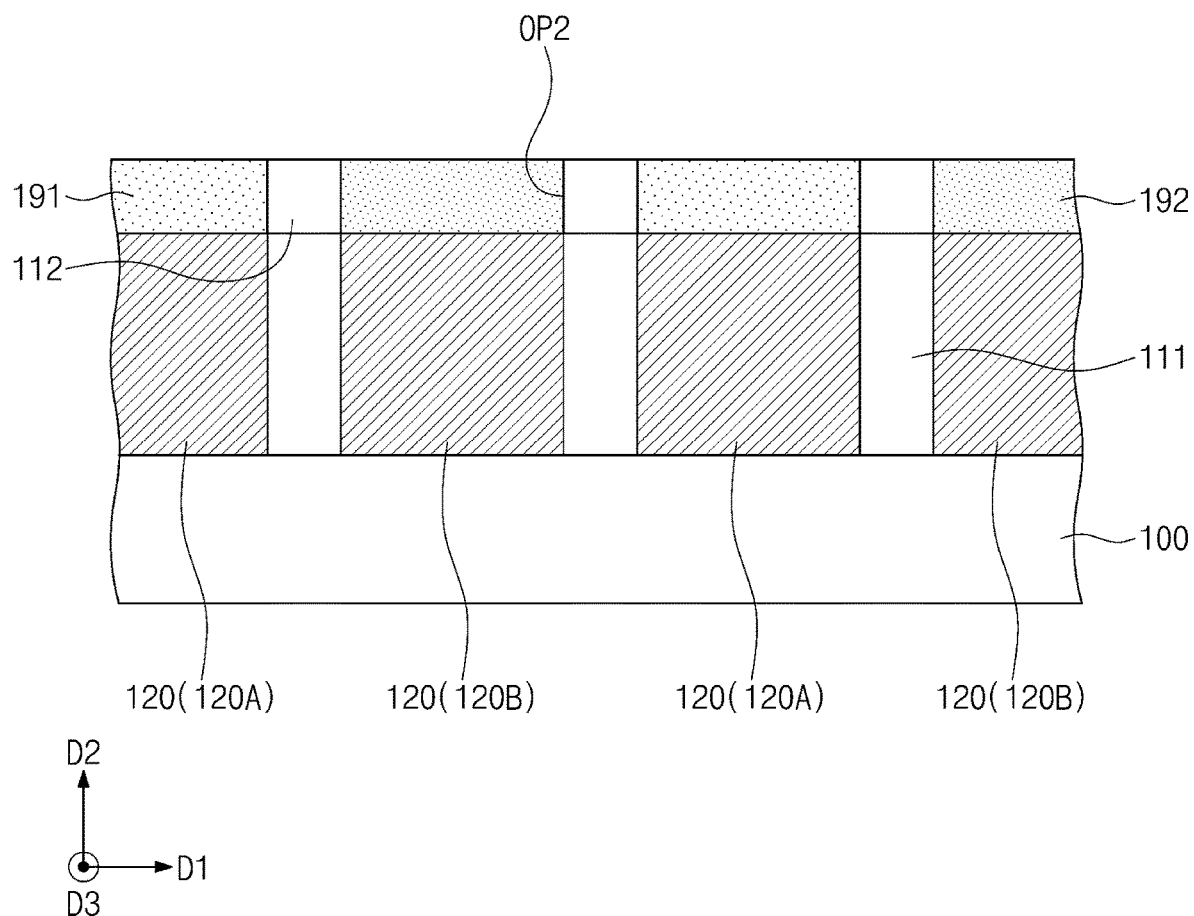

Referring to FIGS. 13 and 14, second patterns 192 may be formed to fill the second openings OP2, respectively. A process of forming the second patterns 192 may include depositing a ferromagnetic material to fill the second openings OP2, and performing a planarization process on the deposited ferromagnetic material until the top surface of the second interlayer insulating layer 112 is exposed. Thus, the first patterns 191 and the second patterns 192 may be alternately arranged and spaced apart from one another in the first direction D1. Top surfaces of the first patterns 191 may be formed at substantially the same level as top surfaces of the second patterns 192, and bottom surfaces of the first patterns 191 may be formed at substantially the same level as bottom surfaces of the second patterns 192. However, embodiments of the inventive concepts are not limited thereto.

The process of forming the second patterns 192 may include aligning magnetization directions of the second patterns 192 by a second external magnetic field. For example, the second patterns 192 may have the magnetization directions Mu fixed in the second direction D2 by the aligning process, as illustrated in FIG. 3. Since the coercive force of the first patterns 191 is greater than the coercive force of the second patterns 192, the magnetization directions Md of the first patterns 191 described with reference to FIGS. 11 and 12 may not be changed by the second external magnetic field but may be maintained.

Figure 15:
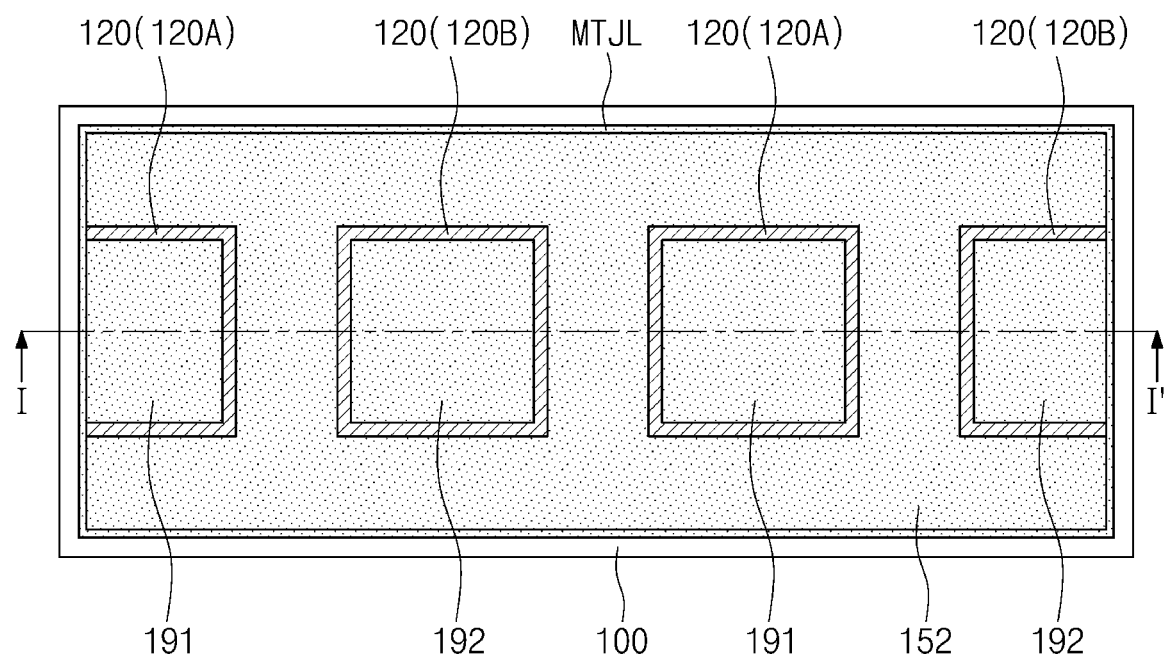
Figure 16:
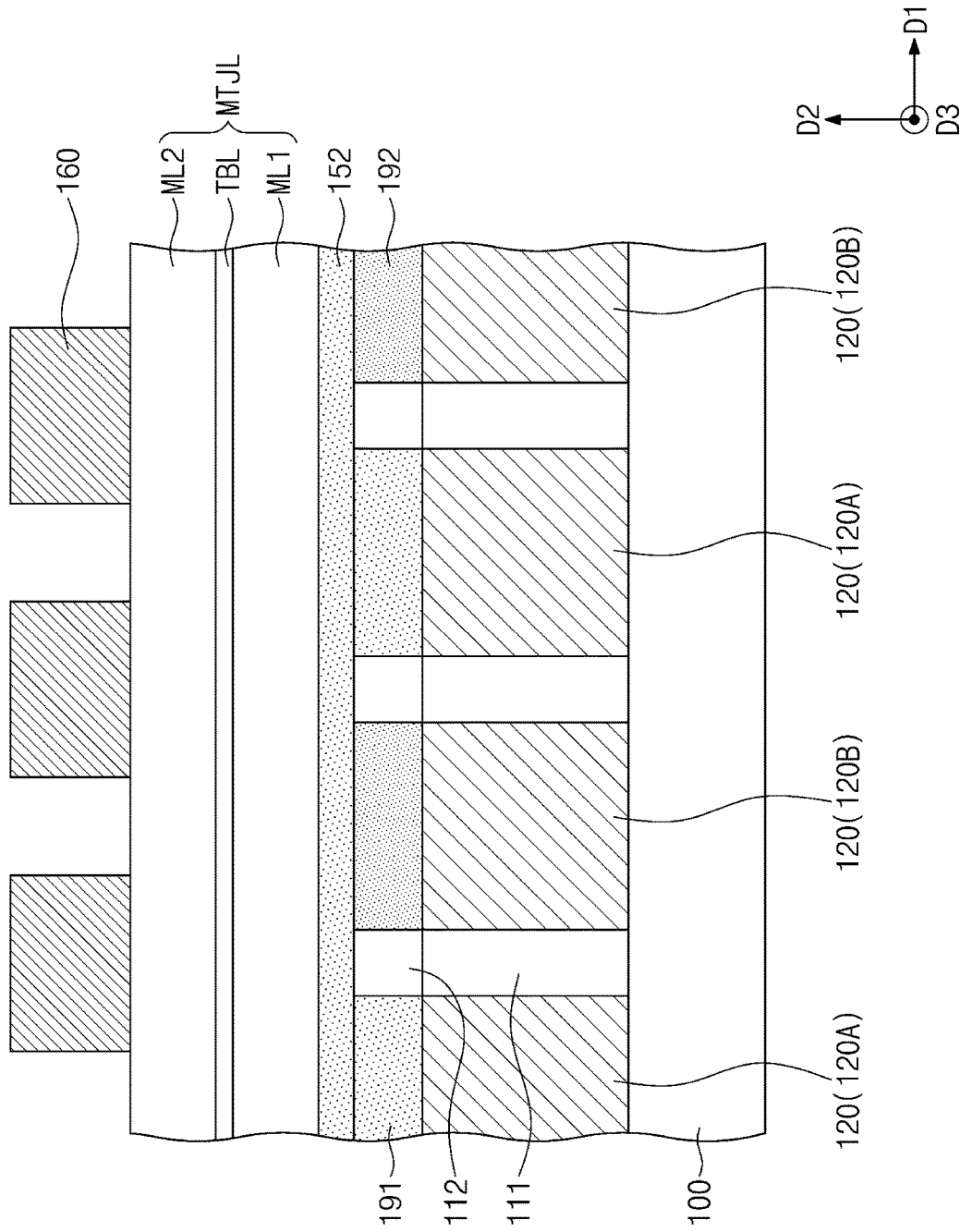

Referring to FIGS. 15 and 16, a first conductive layer 152 and a magnetic tunnel junction layer MTJL may be sequentially formed on the second conductive patterns 191 and 192. The first conductive layer 152 may be formed by a sputtering process, a chemical vapor deposition (CVD) process, or an atomic layer deposition (ALD) process. The magnetic tunnel junction layer MTJL may include a first magnetic layer ML1, a tunnel barrier layer TBL, and a second magnetic layer ML2, which are sequentially stacked on the first conductive layer 152. Each of the first and second magnetic layers ML1 and ML2 may include at least one magnetic layer. The tunnel barrier layer TBL may include a magnesium oxide (MgO) layer, a titanium oxide (TiO) layer, an aluminum oxide (AlO) layer, a magnesium-zinc oxide (MgZnO) layer, and/or a magnesium-boron oxide (MgBO) layer. Each of the first magnetic layer ML1, the tunnel barrier layer TBL and the second magnetic layer ML2 may be formed by a sputtering process or a CVD process.

Electrode patterns 160 may be formed on the magnetic tunnel junction layer MTJL. The electrode patterns 160 may define regions in which magnetic tunnel junction patterns will be formed. For example, the electrode patterns 160 may include a metal (e.g., Ta, W, Ru, or Ir) and/or a conductive metal nitride (e.g., TiN).

Figure 17:
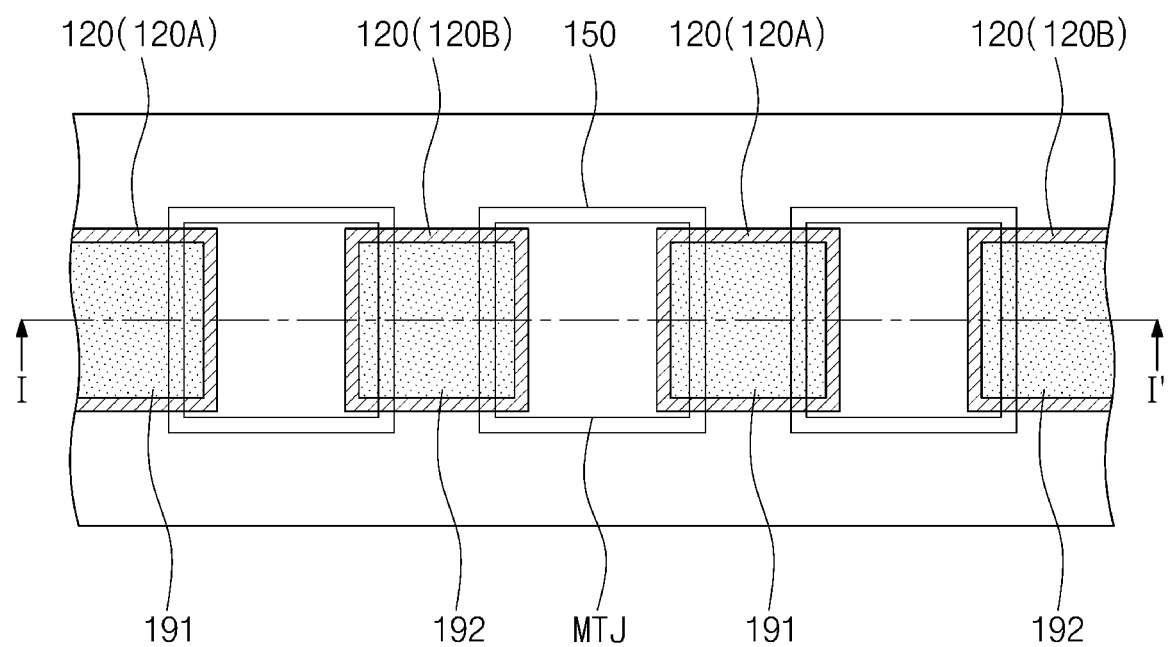
Figure 18:
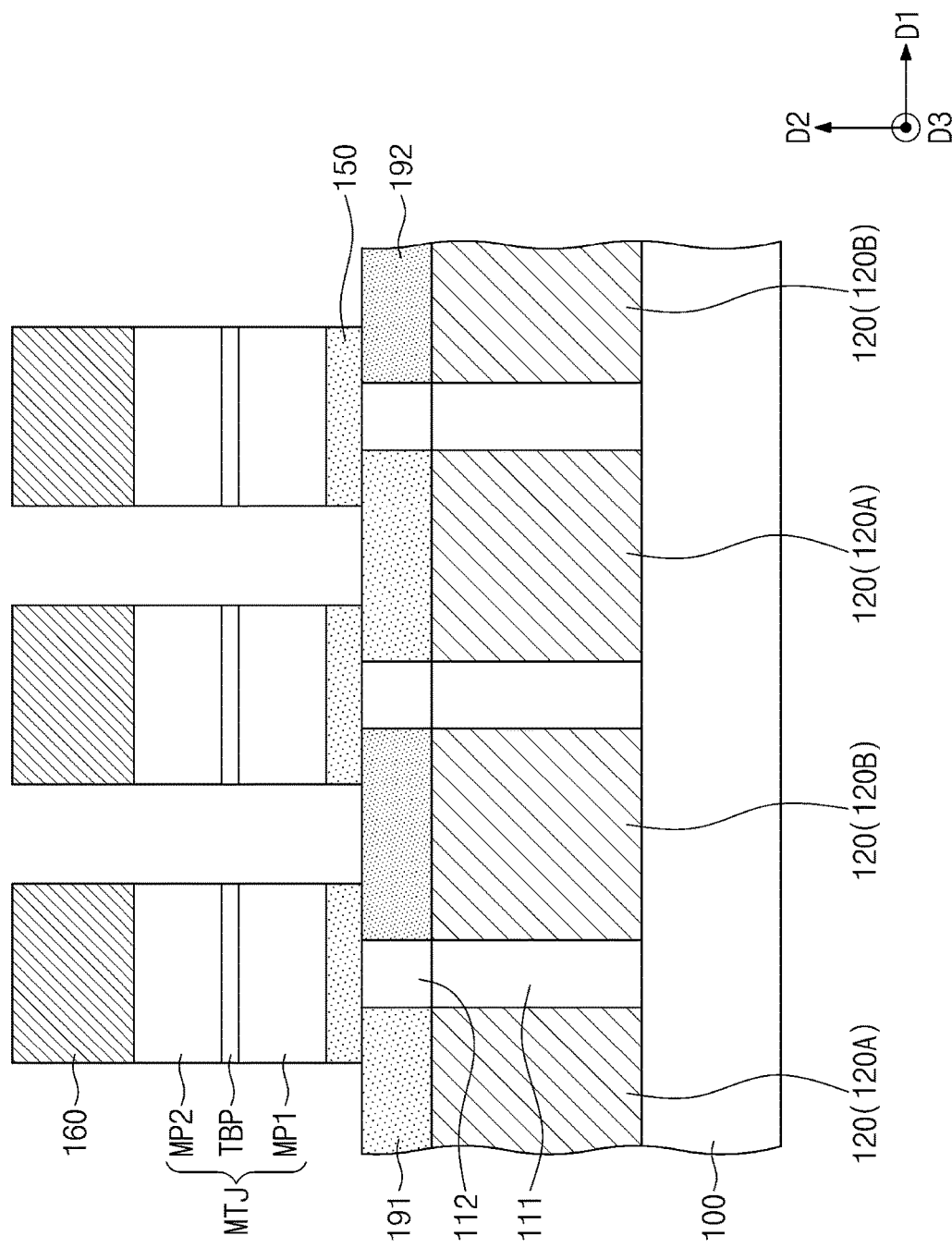

Referring to FIGS. 17 and 18, the magnetic tunnel junction layer MTJL and the first conductive layer 152 may be sequentially etched to form magnetic tunnel junction patterns MTJ and first conductive patterns 150. Each of the first conductive patterns 150 may be disposed between a pair of the second conductive patterns 191 and 192 immediately adjacent to each other in a plan view and may be connected to the pair of second conductive patterns 191 and 192. Each of the second conductive patterns 191 and 192 may be disposed between a pair of the first conductive patterns 150 immediately adjacent to each other in a plan view, and may be connected to the pair of first conductive patterns 150. A top surface of each of the second conductive patterns 191 and 192 may be in contact with bottom surfaces of the first conductive patterns 150.

Each of the magnetic tunnel junction patterns MTJ may include a first magnetic pattern MP1, a tunnel barrier pattern TBP and a second magnetic pattern MP2, which are sequentially stacked on each of the first conductive patterns 150. The first magnetic pattern MP1 and the second magnetic pattern MP2 may be spaced apart from each other with the tunnel barrier pattern TBP interposed therebetween.

The magnetic tunnel junction layer MTJL and the first conductive layer 152 may be etched by, for example, an ion beam etching process. The ion beam etching process may be performed by irradiating an ion beam onto the substrate 100. The ion beam may be irradiated obliquely with respect to the top surface of the substrate 100. The ion beam may include inert ions (e.g., argon positive ions (Ar$^+$)). The ion beam etching process may be performed using the electrode patterns 160 as masks.

Referring again to FIGS. 1 and 2, a third interlayer insulating layer 170 may be formed to cover the magnetic tunnel junction patterns MTJ and the electrode patterns 160. The third interlayer insulating layer 170 may cover sidewalls of the magnetic tunnel junction patterns MTJ and the electrode patterns 160. Upper conductive lines 200 (e.g., bit lines) may be formed on the third interlayer insulating layer 170. Each of the upper conductive lines 200 may be connected to a corresponding one of the magnetic tunnel junction patterns MTJ through a corresponding one of the electrode patterns 160.

Figure 19:
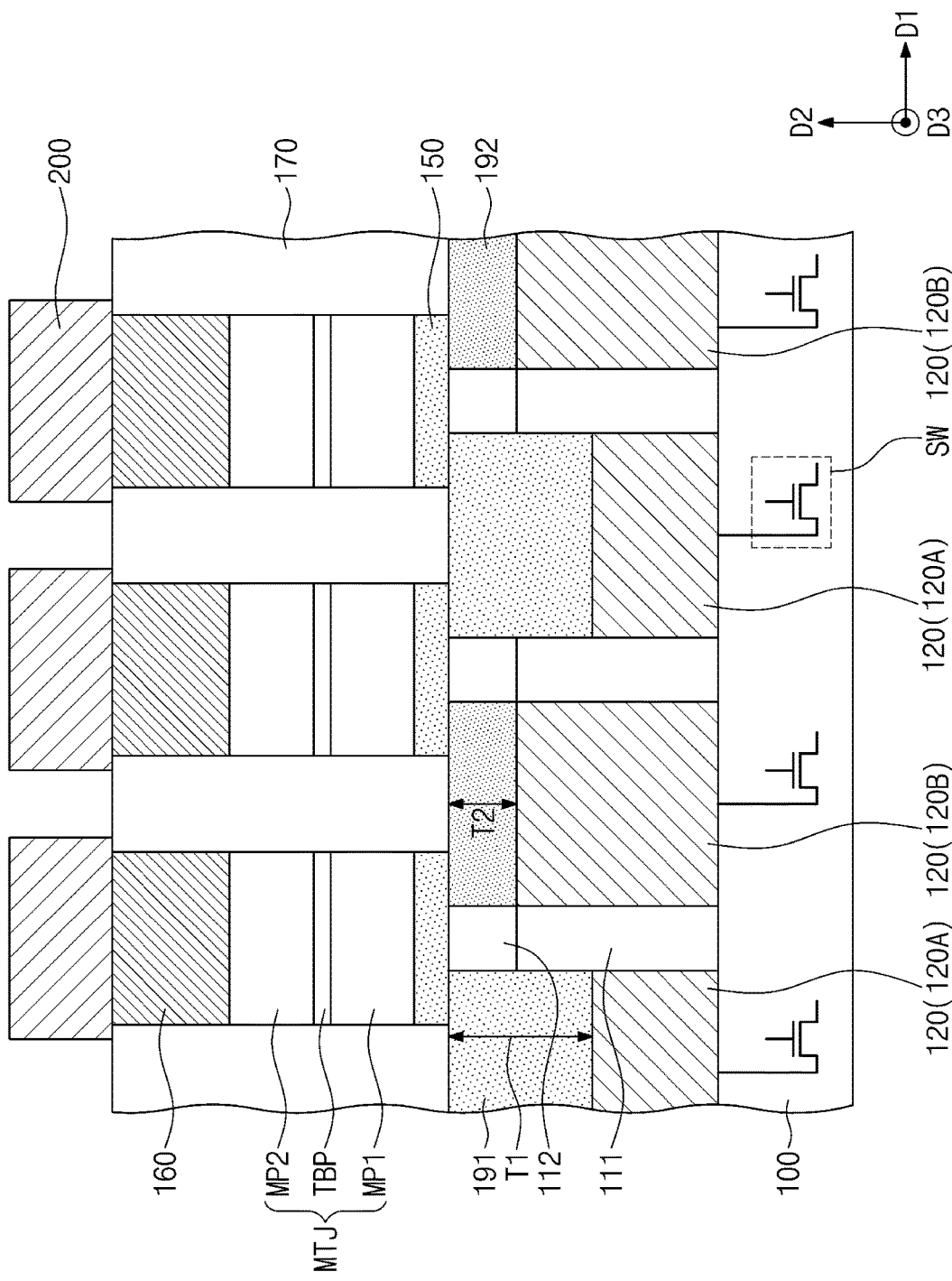
FIG. 19 is a cross-sectional view corresponding to the line I-I' of FIG. 1 to illustrate a magnetic memory device according to some embodiments of the inventive concepts.

FIG. 19 is a cross-sectional view corresponding to the line I-I' of FIG. 1 to illustrate a magnetic memory device according to some embodiments of the inventive concepts. Hereinafter, the descriptions to the same components and features as in the above embodiments will be omitted for ease of explanation.

Referring to FIG. 19, in a magnetic memory device according to the present embodiment, volumes (including lengths, widths, heights/thicknesses, and/or cross-sectional areas) of first patterns 191 may be different from volumes of second patterns 192. For example, the volume of each of the first patterns 191 may be greater than the volume of each of the second patterns 192. For example, a cross-sectional area of each of the first patterns 191 may be greater than a cross-sectional area of each of the second patterns 192. In the present embodiment, a first thickness T1 of each of the first patterns 191 may be greater than a second thickness T2 of each of the second patterns 192. For example, the first thickness T1 may range from about 2 times to about 7 times the second thickness T2.

In the present embodiment, the first patterns 191 and the second patterns 192 may be formed of the same material. Since the volumes of the first patterns 191 are greater than the volumes of the second patterns 192, an effective coercive force of the first patterns 191 may be greater than an effective coercive force of the second patterns 192. In the present specification, the effective coercive force may be a coercive force considering a volume of a corresponding pattern. For example, the effective coercive force may be determined by a thickness of a corresponding pattern and/or an internal crystal structure (e.g., a grain size) of the corresponding pattern. Magnetization directions of the first and second patterns 191 and 192 may be the same as described with reference to FIGS. 3 to 6.

Figure 20:
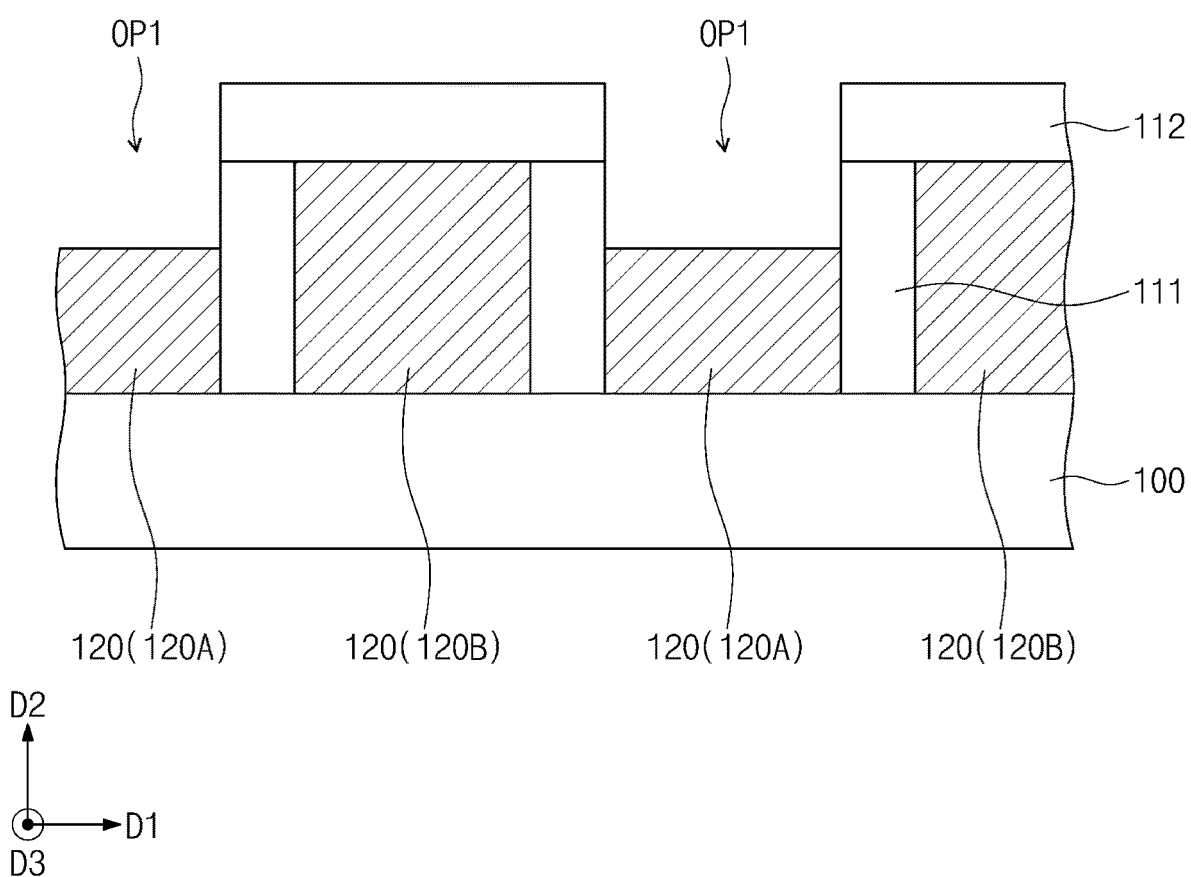
FIGS. 20 to 22 are cross-sectional views taken along the line I-I' of FIG. 1 to illustrate a method of manufacturing a magnetic memory device, according to some embodiments of the inventive concepts.
Figure 21:
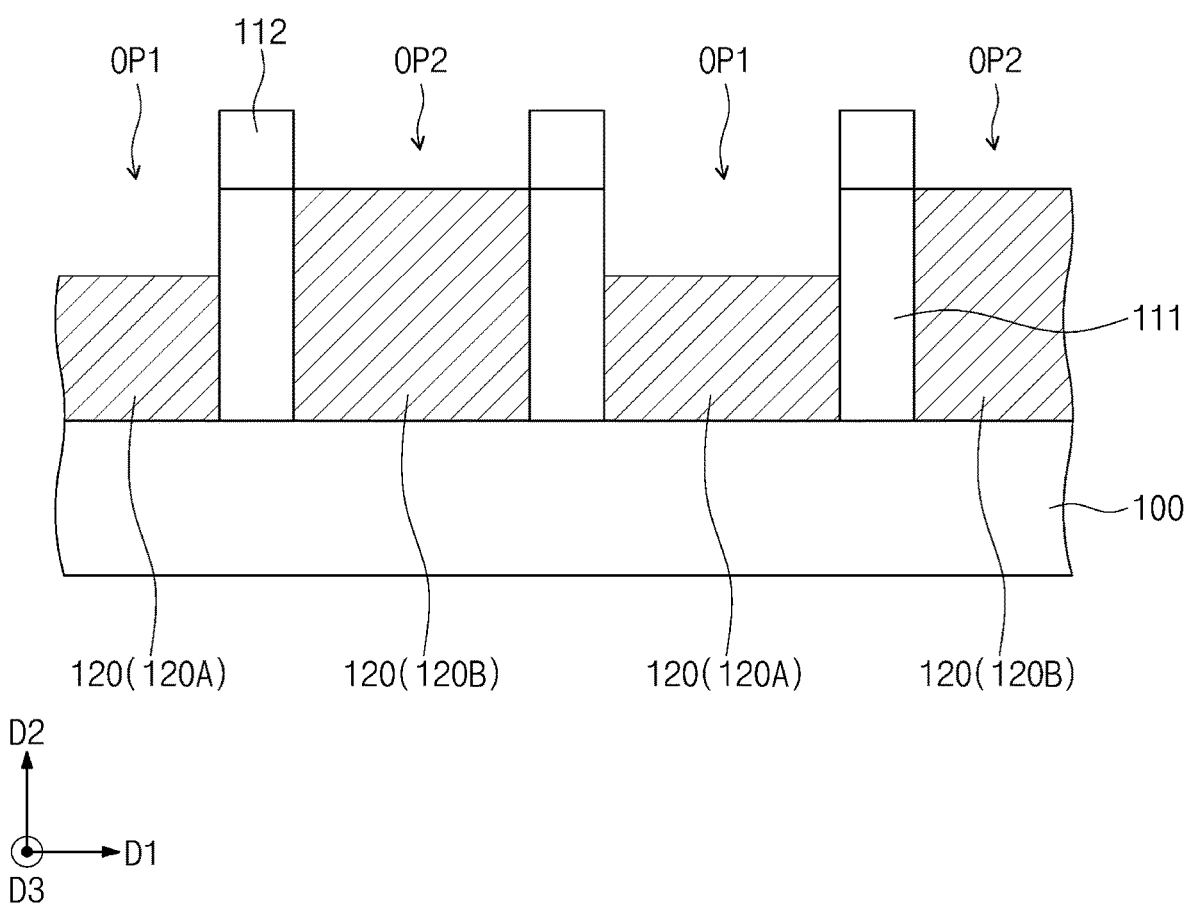
Figure 22:
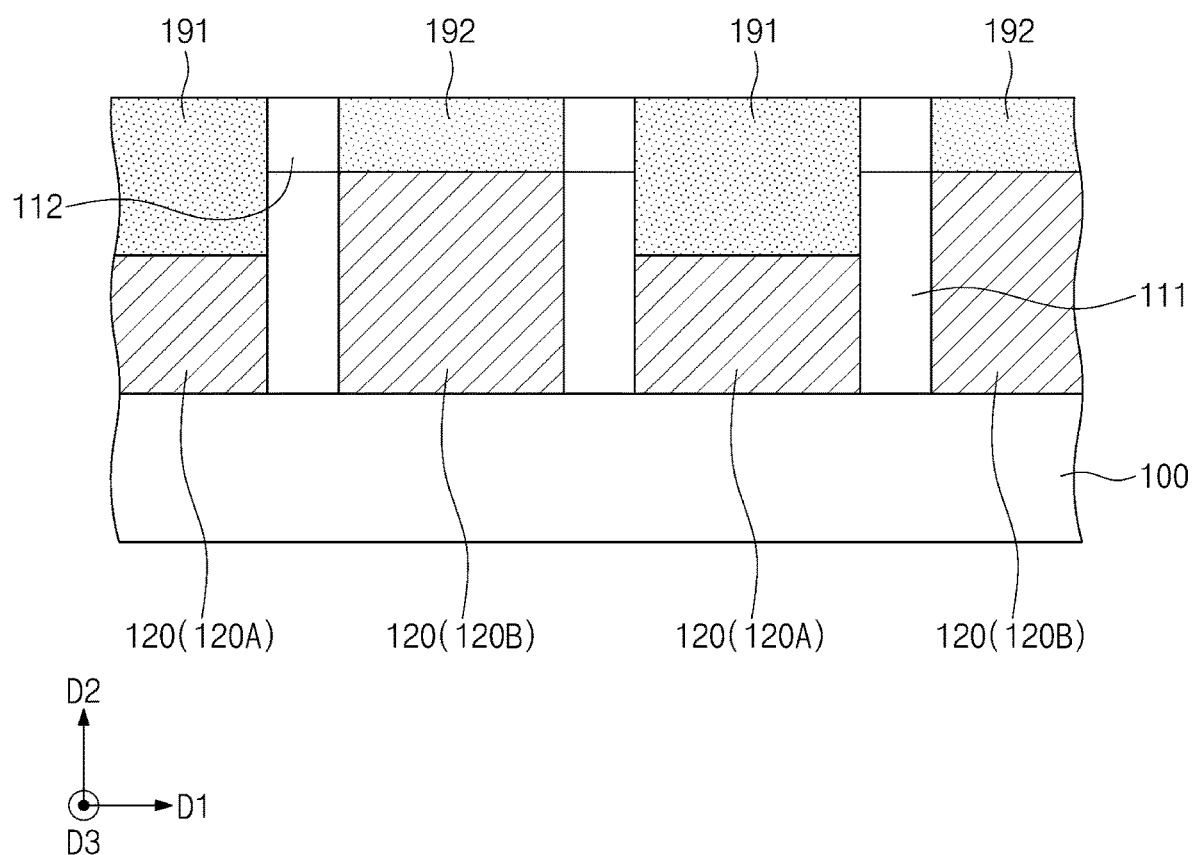

FIGS. 20 to 22 are cross-sectional views taken along the line I-I' of FIG. 1 to illustrate a method of manufacturing a magnetic memory device, according to some embodiments of the inventive concepts.

Referring to FIG. 20, upper portions of the first lower contact plugs 120A in the structure of FIGS. 9 and 10 may be etched. For example, the first lower contact plugs 120A may be etched by a wet etching process. By the etching process, the first openings OP1 may extend between the second lower contact plugs 120B.

Referring to FIG. 21, a patterning process may be performed on the second interlayer insulating layer 112 to form second openings OP2 exposing the second lower contact plugs 120B. In some embodiments, a sacrificial layer may be formed to fill the first openings OP1, and the sacrificial layer may be removed after the formation of the second openings OP2. Depths of the second openings OP2 may be less than depths of the first openings OP1.

Referring to FIG. 22, first patterns 191 filling the first openings OP1 and second patterns 192 filling the second openings OP2 may be formed. The first patterns 191 and the second patterns 192 may be formed of the same material at the same time by the same deposition process. For example, a ferromagnetic layer may be formed to fill the first openings OP1 and the second openings OP2, and then, a planarization process may be performed on the ferromagnetic layer until the second interlayer insulating layer 112 is exposed.

A first external magnetic field may be applied to align magnetization directions of the first patterns 191 and magnetization directions of the second patterns 192 in the direction opposite to the second direction D2. Thereafter, a second external magnetic field weaker than the first external magnetic field may be applied to align the magnetization directions of the second patterns 192 in the second direction D2. The effective coercive force of the first patterns 191 may be greater than that of the second patterns 192, and thus the magnetization directions of the first patterns 191 may not be changed by the second external magnetic field but may be maintained in the direction opposite to the second direction D2. As a result, the magnetization directions of the first and second patterns 191 and 192 may have the directions illustrated in FIG. 3.

Referring again to FIG. 19, the processes described with reference to FIGS. 15 to 19, 1 and 2 may be performed on the resultant structure of FIG. 22. As a result, magnetic tunnel junction patterns MTJ, first conductive patterns 150, electrode patterns 160 and upper conductive lines 200 may be formed.

Figure 24:
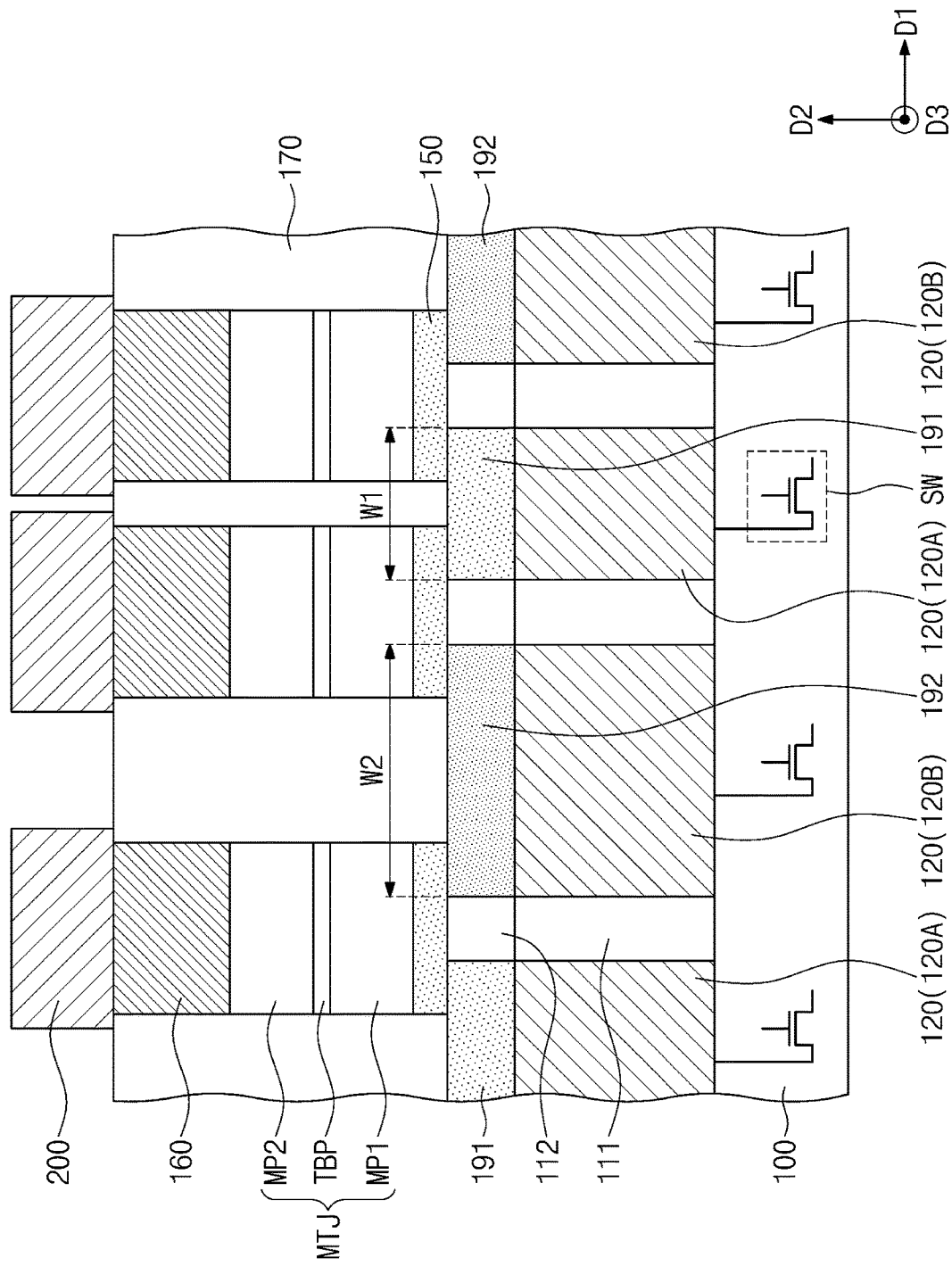
FIG. 24 is a cross-sectional view taken along a line I-I' of FIG. 23.

FIG. 23 is a plan view illustrating a magnetic memory device according to some embodiments of the inventive concepts. FIG. 24 is a cross-sectional view taken along a line I-I' of FIG. 23.

Referring to FIGS. 23 and 24, in a magnetic memory device according to the present embodiment, volumes of first patterns 191 may be different from volumes of second patterns 192. For example, a cross-sectional area of each of the first patterns 191 may be less than a cross-sectional area of each of the second patterns 192. For example, a second width W2 of the second pattern 192 in the first direction D1 may be greater than a first width W1 of the first pattern 191 in the first direction D1. For example, the second width W2 may range from about 1.5 times to about 3 times the first width W1.

In the present embodiment, the first patterns 191 and the second patterns 192 may be formed of the same material. Since volumes of the first patterns 191 are less than volumes of the second patterns 192, an effective coercive force of the first patterns 191 may be less than an effective coercive force of the second patterns 192. Magnetization directions of the first and second patterns 191 and 192 may be the same as described with reference to FIGS. 3 to 6.

Figure 25:
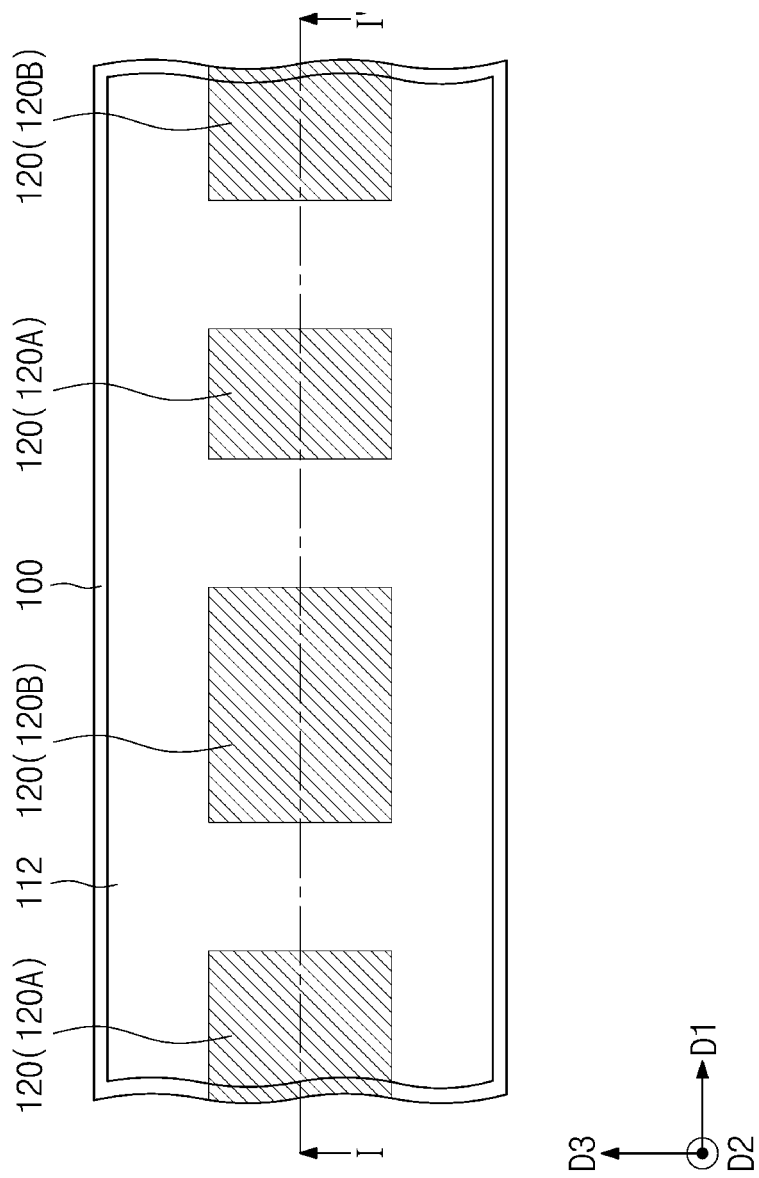
FIGS. 25 and 27 are plan views illustrating a method of manufacturing a magnetic memory device, according to some embodiments of the inventive concepts.
Figure 27:
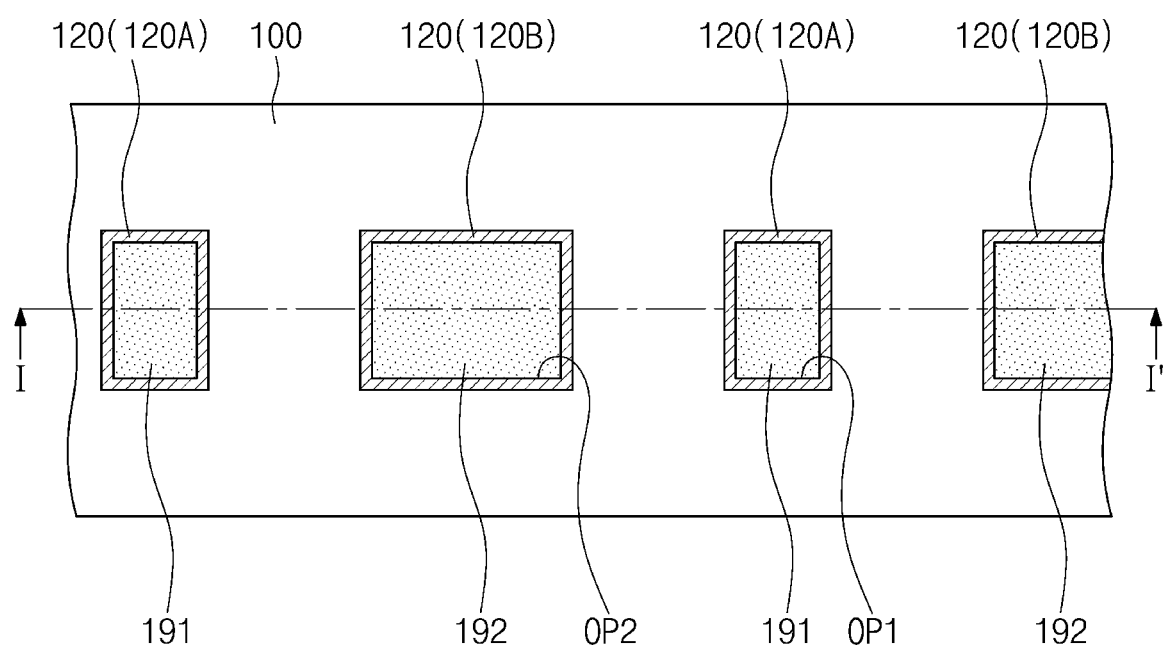
Figure 28:
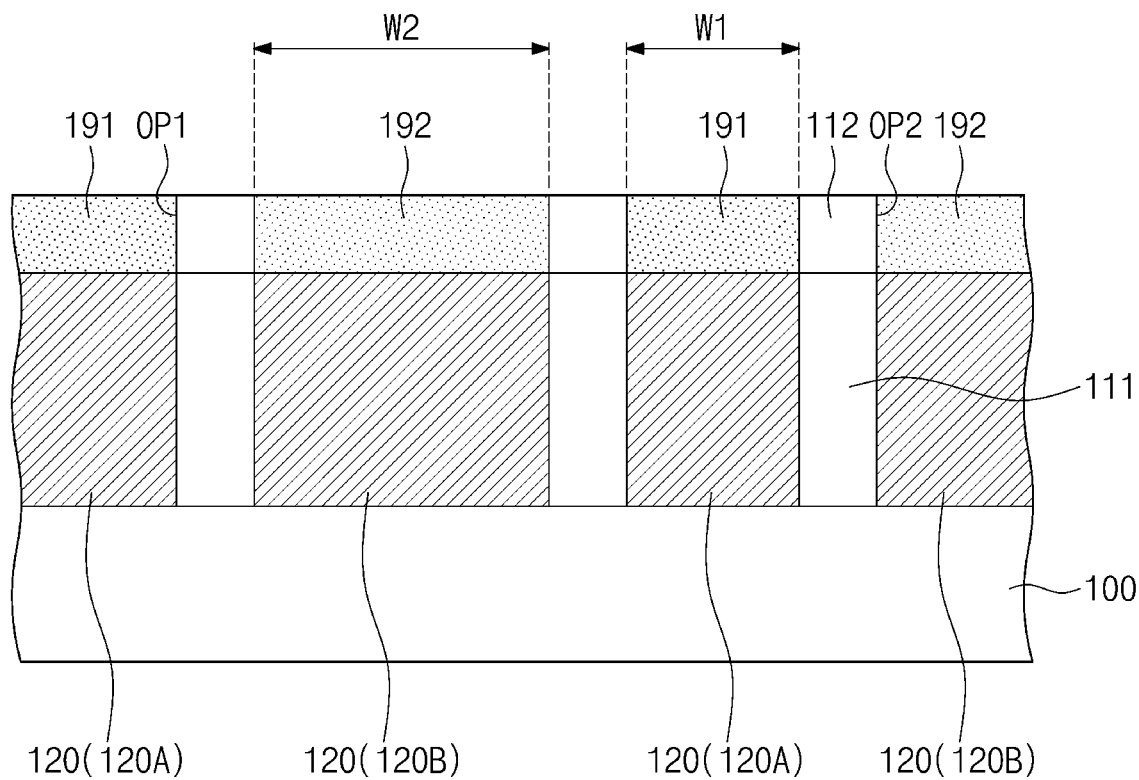

FIGS. 25 and 27 are plan views illustrating a method of manufacturing a magnetic memory device, according to some embodiments of the inventive concepts. FIGS. 26 and 28 are cross-sectional views taken along lines I-I' of FIGS. 25 and 27, respectively.

Referring to FIGS. 25 and 26, lower contact plugs 120 may be formed in the first interlayer insulating layer 111. Widths of first lower contact plugs 120A in the first direction D1 may be different from widths of second lower contact plugs 120B in the first direction D1. For example, the widths of the second lower contact plugs 120B may be greater than the widths of the first lower contact plugs 120A. Alternatively, the widths of the second lower contact plugs 120B may be substantially equal to the widths of the first lower contact plugs 120A. Thereafter, a second interlayer insulating layer 112 may be deposited.

Referring to FIGS. 27 and 28, first openings OP1 exposing the first lower contact plugs 120A and second openings OP2 exposing the second lower contact plugs 120B may be formed in the second interlayer insulating layer 112. A second width W2 of the second opening OP2 in the first direction D1 may be greater than a first width W1 of the first opening OP1 in the first direction D1.

Thereafter, first patterns 191 may be formed in the first openings OP1, respectively, and second patterns 192 may be formed in the second openings OP2, respectively. The first patterns 191 and the second patterns 192 may be formed of the same material at the same time by the same deposition process. For example, a ferromagnetic layer may be formed to fill the first openings OP1 and the second openings OP2, and then, a planarization process may be performed on the ferromagnetic layer until the second interlayer insulating layer 112 is exposed.

A first external magnetic field may be applied to align magnetization directions of the first patterns 191 and magnetization directions of the second patterns 192 in the second direction D2. Thereafter, a second external magnetic field weaker than the first external magnetic field may be applied to align the magnetization directions of the first patterns 191 in the direction opposite to the second direction D2. The effective coercive force of the second patterns 192 may be greater than that of the first patterns 191, and thus the magnetization directions of the second patterns 192 may not be changed by the second external magnetic field but may be maintained in the second direction D2. As a result, the magnetization directions of the first and second patterns 191 and 192 may have the directions illustrated in FIG. 3.

Referring again to FIG. 24, the processes described with reference to FIGS. 15 to 19, 1 and 2 may be performed on the resultant structure of FIG. 28. As a result, magnetic tunnel junction patterns MTJ, first conductive patterns 150, electrode patterns 160 and upper conductive lines 200 may be formed.

Figure 29:
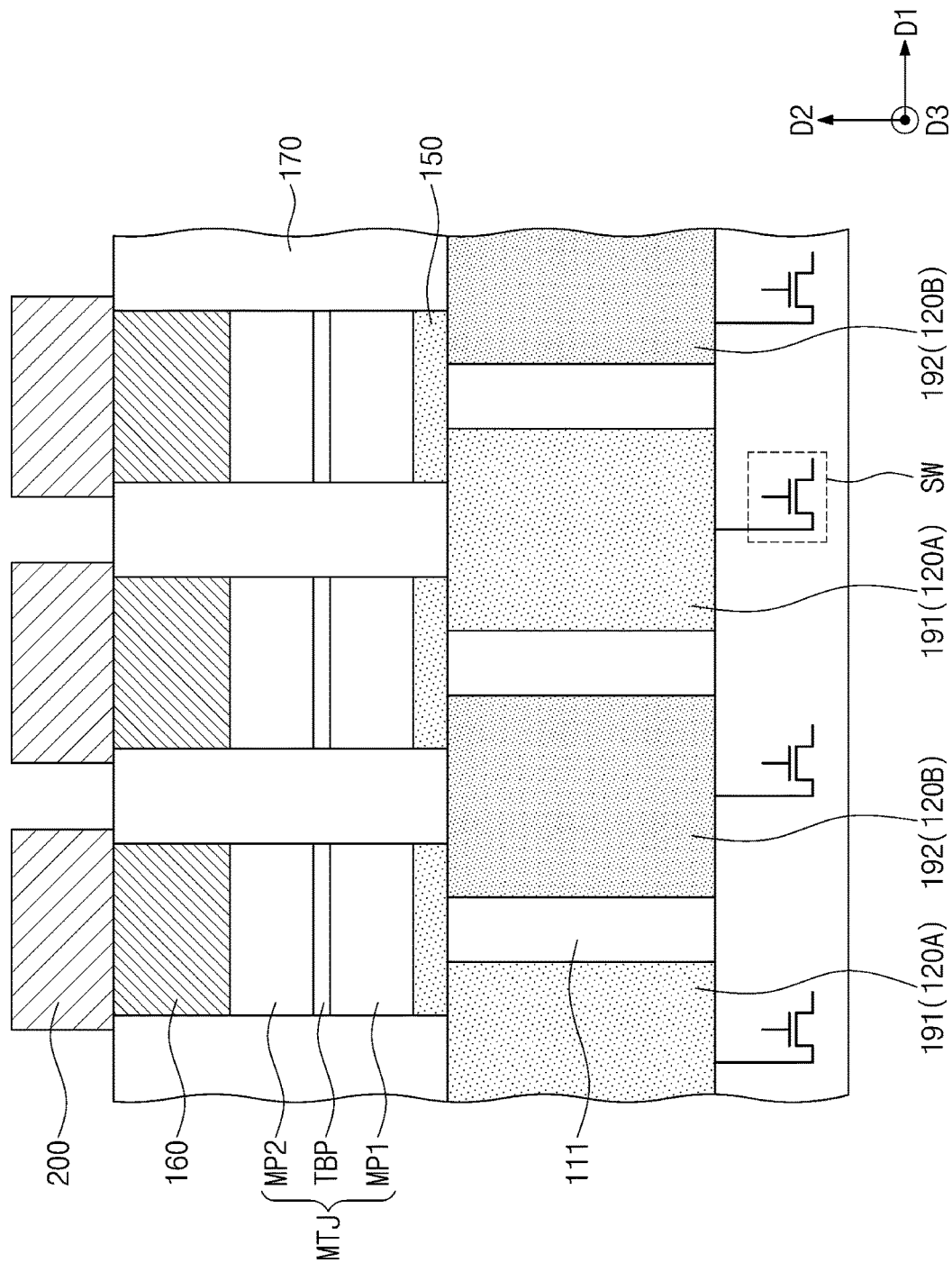
FIG. 29 is a cross-sectional view taken along the line I-I' of FIG. 1 illustrating a magnetic memory device according to some embodiments of the inventive concepts.

FIG. 29 is a cross-sectional view taken along the line I-I' of FIG. 1 to illustrate a magnetic memory device according to some embodiments of the inventive concepts. In the present embodiment, separate lower contact plugs 120A and 120B under second conductive patterns 191 and 192 may be omitted, and the second conductive patterns 191 and 192 may be used as the lower contact plugs 120A and 120B, respectively.

Figure 30:
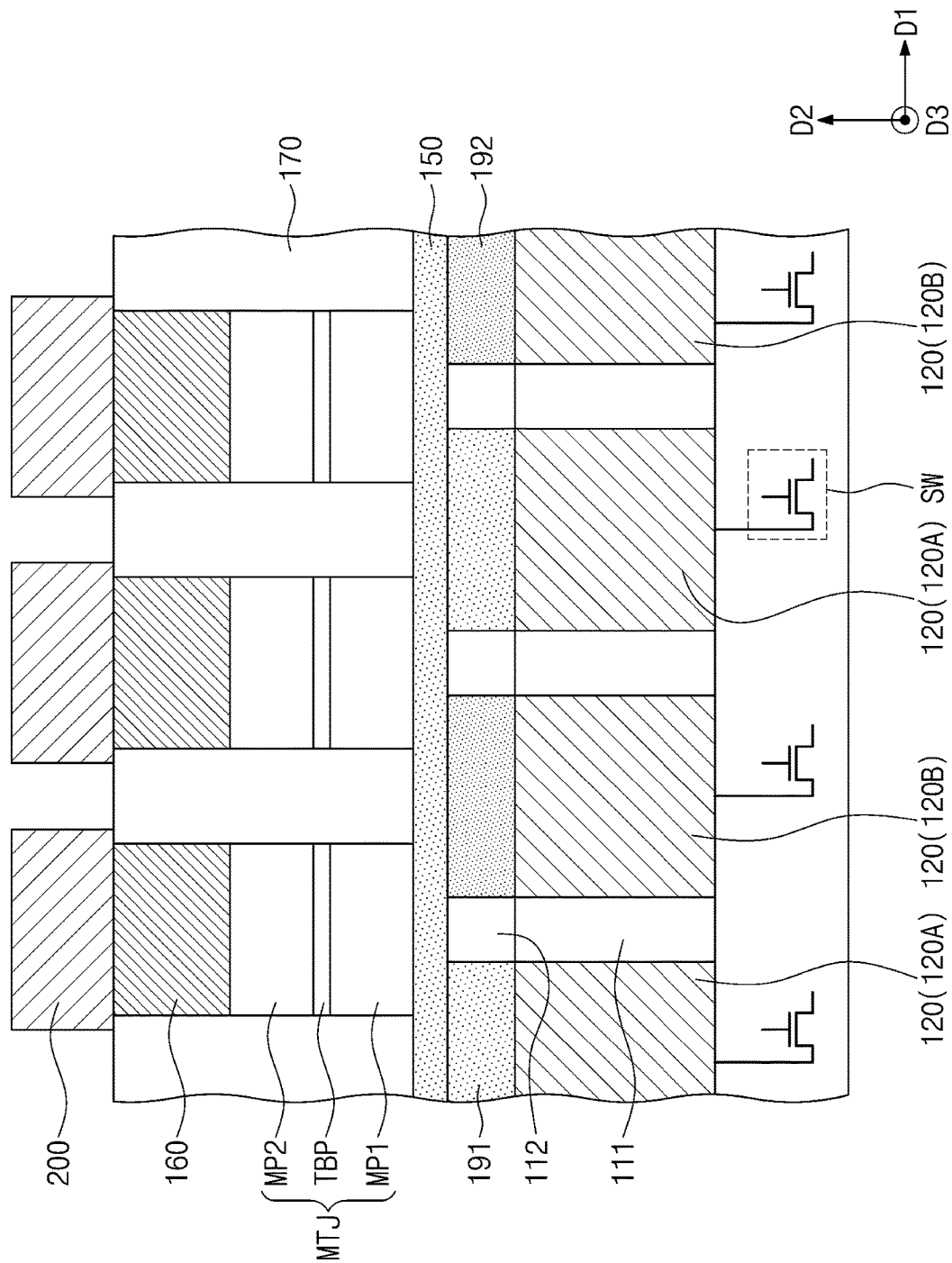
FIG. 30 is a cross-sectional view taken along the line I-I' of FIG. 1 illustrating a magnetic memory device according to some embodiments of the inventive concepts.

FIG. 30 is a cross-sectional view taken along the line I-I' of FIG. 1 to illustrate a magnetic memory device according to some embodiments of the inventive concepts. In the present embodiment, a first conductive pattern 150 may not be cut or divided between the magnetic tunnel junction patterns MTJ but may have a linear or line shape continuously extending in the first direction D1. Thus, the first conductive pattern 150 may continuously extend in the first direction D1 and may be alternately connected to the first patterns 191 and the second patterns 192, which are spaced apart along the first direction D1.

According to the embodiments of the inventive concepts, the magnetic memory device capable of reducing a switching current may be provided. According to the embodiments of the inventive concepts, it is possible to provide the magnetic memory device capable of allowing the magnetization direction of the free layer to be more easily aligned in the perpendicular direction after switching the free layer.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A magnetic memory device comprising:
a magnetic tunnel junction pattern on a substrate;
a first conductive pattern between the substrate and the magnetic tunnel junction pattern;
lower contact plugs between the first conductive pattern and the substrate and disposed at respective sides of the magnetic tunnel junction pattern; and
second conductive patterns on the lower contact plugs, respectively, wherein the second conductive patterns connect the lower contact plugs to the first conductive pattern,
wherein the second conductive patterns comprise a ferromagnetic material.

2. The magnetic memory device of claim 1, wherein first and second patterns of the second conductive patterns are connected to first and second end portions of the first conductive pattern, respectively.

3. The magnetic memory device of claim 1, wherein the second conductive patterns comprise:
a first pattern disposed at one side of the first conductive pattern; and
a second pattern disposed at another side of the first conductive pattern,
wherein the first and second patterns have first and second magnetization directions, respectively, that are fixed in opposite directions to each other.

4. The magnetic memory device of claim 3, wherein the first pattern has the first magnetization direction fixed in a direction perpendicular to a top surface of the substrate, and
wherein the second pattern has the second magnetization direction fixed in a direction opposite to the first magnetization direction of the first pattern.

5. The magnetic memory device of claim 3, wherein the first pattern and the second pattern are spaced apart from each other in a first direction parallel to a top surface of the substrate, and
wherein the first and second magnetization directions are parallel to a second direction which is parallel to the top surface of the substrate and intersects the first direction.

6. The magnetic memory device of claim 3, wherein the first pattern and the second pattern comprise different materials from each other.

7. The magnetic memory device of claim 3, wherein the first pattern and the second pattern have substantially equal thicknesses and substantially equal widths.

8. The magnetic memory device of claim 3, wherein the first pattern and the second pattern have different volumes from each other.

9. The magnetic memory device of claim 8, wherein the first pattern and the second pattern comprise a same material.

10. The magnetic memory device of claim 3, wherein the first pattern and the second pattern have different thicknesses from each other.

11. The magnetic memory device of claim 3, wherein the first pattern and the second pattern have different widths from each other.

12. A magnetic memory device comprising:
magnetic tunnel junction patterns arranged along and spaced apart in a first direction on a substrate;
first conductive patterns under bottom surfaces of the magnetic tunnel junction patterns, respectively; and
lower conductive patterns between the substrate and the first conductive patterns, wherein the lower conductive patterns are disposed between the magnetic tunnel junction patterns in a plan view and connect adjacent ones of the first conductive patterns,
wherein the lower conductive patterns comprise first lower conductive patterns and second lower conductive patterns, which are alternately arranged in the first direction, and
wherein the first lower conductive patterns and the second lower conductive patterns have first and second magnetization directions, respectively, that are fixed in opposite directions to each other.

13. The magnetic memory device of claim 12, wherein the first and second magnetization directions are perpendicular to a top surface of the substrate.

14. The magnetic memory device of claim 12, wherein the first and second magnetization directions are parallel to a second direction which is parallel to a top surface of the substrate and intersects the first direction.

15. The magnetic memory device of claim 12, wherein the first lower conductive patterns and the second lower conductive patterns comprise different materials from each other.

16. The magnetic memory device of claim 12, wherein the first lower conductive patterns and the second lower conductive patterns have different thicknesses or different widths from each other.

17. A magnetic memory device comprising:
magnetic tunnel junction patterns arranged along and spaced apart in a first direction on a substrate;
first conductive patterns under bottom surfaces of the magnetic tunnel junction patterns, respectively; and
second conductive patterns between the substrate and the first conductive patterns and including a ferromagnetic material, wherein the second conductive patterns are disposed between the magnetic tunnel junction patterns in a plan view and connect adjacent ones of the first conductive patterns,
wherein the second conductive patterns comprise:
first patterns disposed at first sides of the first conductive patterns; and
second patterns disposed at second sides of the first conductive patterns,
wherein a cross-sectional area of each of the second patterns is greater than a cross-sectional area of each of the first patterns.

18. The magnetic memory device of claim 17, wherein the first patterns and the second patterns comprise a same material.

19. The magnetic memory device of claim 18, wherein first thicknesses or widths of the first patterns are different from second thicknesses or widths of the second patterns.

20. The magnetic memory device of claim 18, wherein first widths of the first patterns are different from second widths of the second patterns.

* * * * *